US012628415B2

(12) United States Patent
Lin et al.

(10) Patent No.: US 12,628,415 B2
(45) Date of Patent: May 12, 2026

(54) POST-REPLACEMENT METAL GATE (RMG) GATE CUT FOR PERFORMANCE ENHANCED FINFET

(71) Applicant: QUALCOMM Incorporated, San Diego, CA (US)

(72) Inventors: Ming-Huei Lin, New Taipei (TW); Haining Yang, San Diego, CA (US); Junjing Bao, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 530 days.

(21) Appl. No.: 18/098,633

(22) Filed: Jan. 18, 2023

(65) Prior Publication Data

US 2024/0243131 A1      Jul. 18, 2024

(51) Int. Cl.
| | |
|---|---|
| *H10D 84/00* | (2025.01) |
| *H10D 84/01* | (2025.01) |
| *H10D 84/03* | (2025.01) |
| *H10D 84/85* | (2025.01) |
| *H01L 21/3115* | (2006.01) |

(52) U.S. Cl.
CPC ....... *H10D 84/853* (2025.01); *H10D 84/0172* (2025.01); *H10D 84/0188* (2025.01); *H10D 84/0193* (2025.01); *H10D 84/038* (2025.01); *H01L 21/31155* (2013.01)

(58) Field of Classification Search
CPC .......... H10D 84/0165; H10D 84/0167; H10D 84/0172; H10D 84/0188; H10D 84/0193
See application file for complete search history.

(56) References Cited

U.S. PATENT DOCUMENTS

| | | | |
|---|---|---|---|
| 9,537,007 B2 | 1/2017 | Yang et al. | |
| 11,121,043 B2 | 9/2021 | Posseme et al. | |
| 2017/0033107 A1 | 2/2017 | Hong et al. | |
| 2019/0333914 A1 | 10/2019 | Min | |
| 2022/0336633 A1 | 10/2022 | Yeoh et al. | |
| 2023/0139399 A1* | 5/2023 | Zhou ................... | H10D 62/118 |
| | | | 257/506 |
| 2023/0411292 A1* | 12/2023 | Li ........................ | H10D 84/038 |

OTHER PUBLICATIONS

International Search Report and Written Opinion—PCT/US2023/081392—ISA/EPO—Apr. 2, 2024.

* cited by examiner

*Primary Examiner* — Reema Patel
(74) *Attorney, Agent, or Firm* — Seyfarth Shaw LLP

(57) ABSTRACT

A fin field effect transistor (FinFET) is described. The FinFET includes a substrate and a shallow trench isolation (STI) region on the substrate. The FinFET also includes a first fin structure on the substrate and extending through the STI region. The FinFET further includes a second fin structure on the substrate and extending through the STI region. The FinFET also includes a metal gate on the STI region, on the first fin structure, and on the second fin structure. The metal gate is composed of a first sub-metal gate cut line filled with a first stressor material, and a second sub-metal gate cut line filled with a second stressor material different from the first stressor material.

8 Claims, 21 Drawing Sheets

106

LAYER  214

LAYER  212

LAYER  210

SUBSTRATE
200

WELL  202     WELL  204     WELL  206     WELL  208

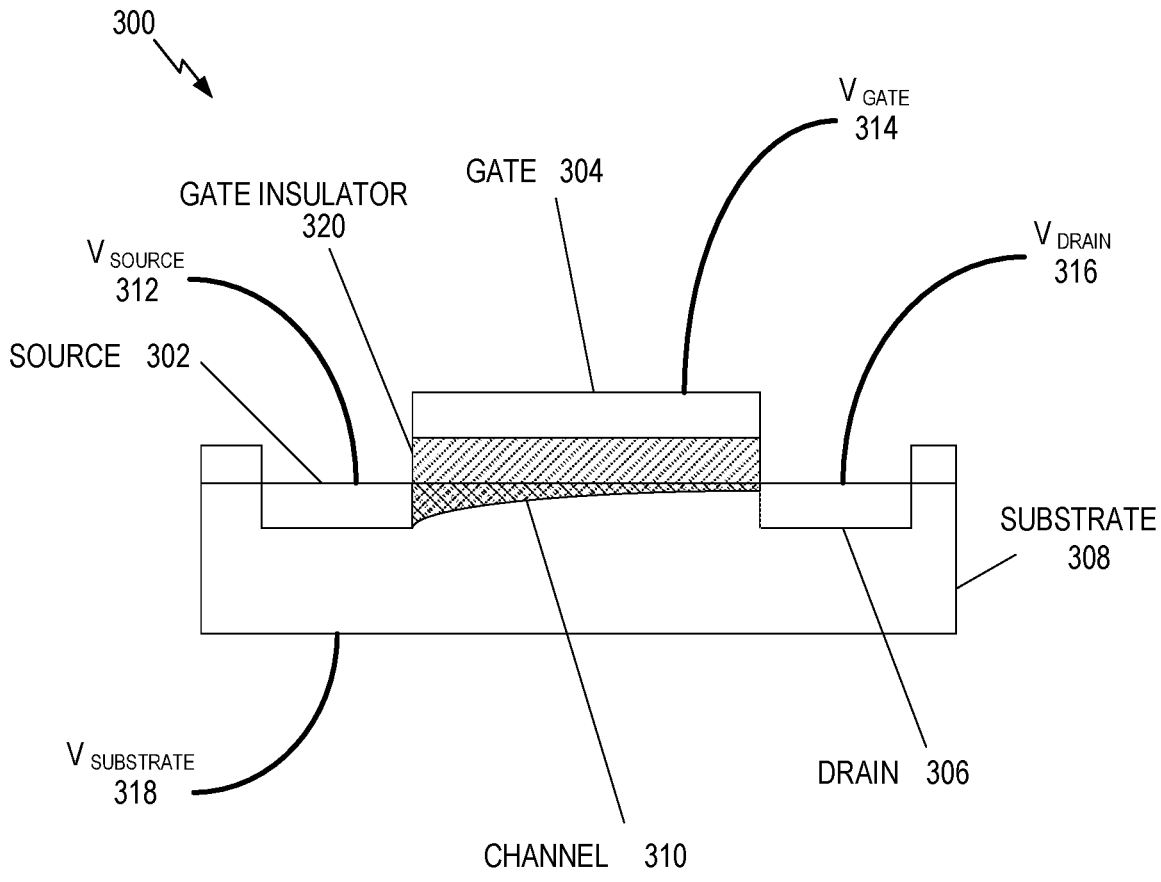
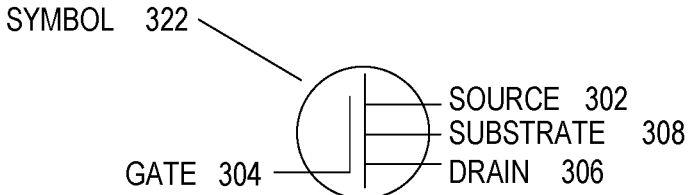
*FIG. 3*

700
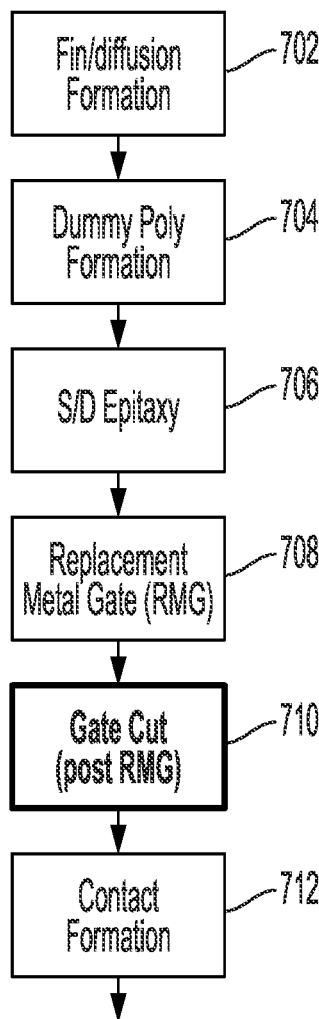
Fin/diffusion Formation — 702
Dummy Poly Formation — 704
S/D Epitaxy — 706
Replacement Metal Gate (RMG) — 708
Gate Cut (post RMG) — 710
Contact Formation — 712
*FIG. 7*

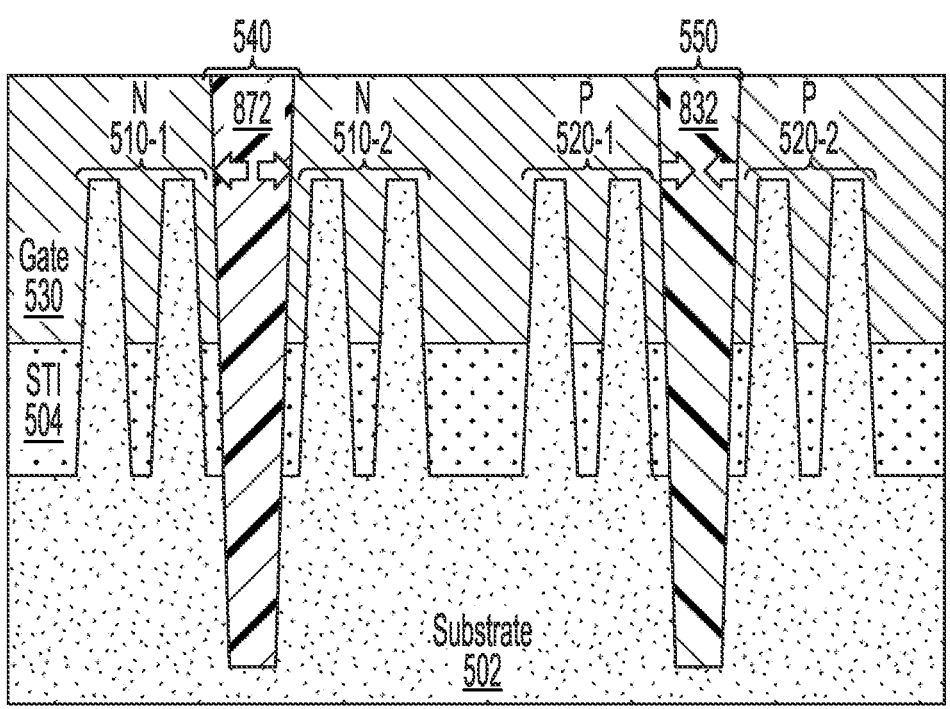
FIG. 8I

900

910

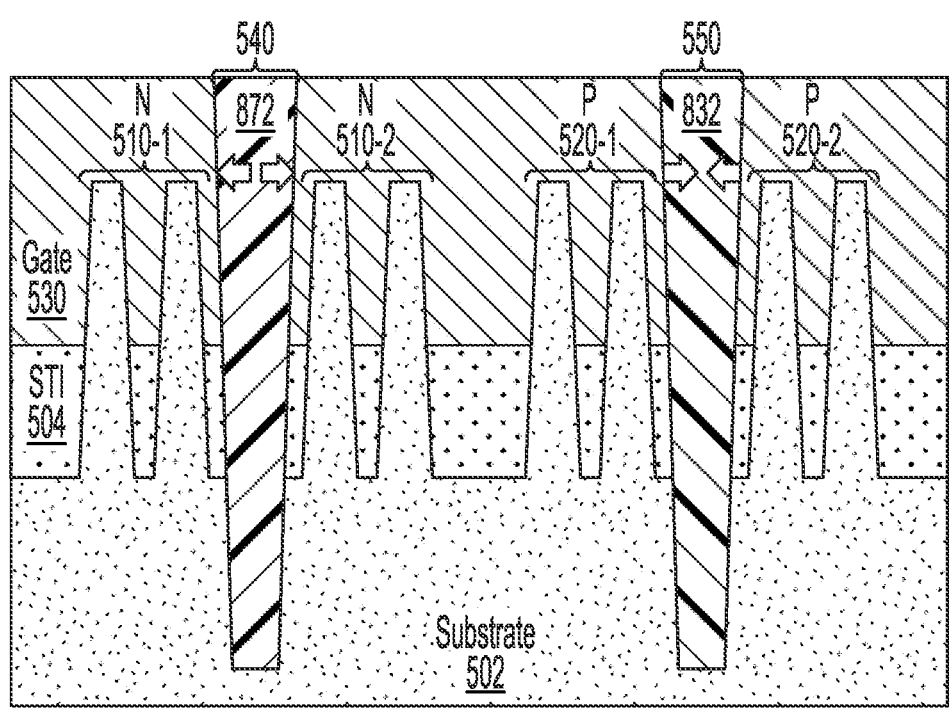
FIG. 9G

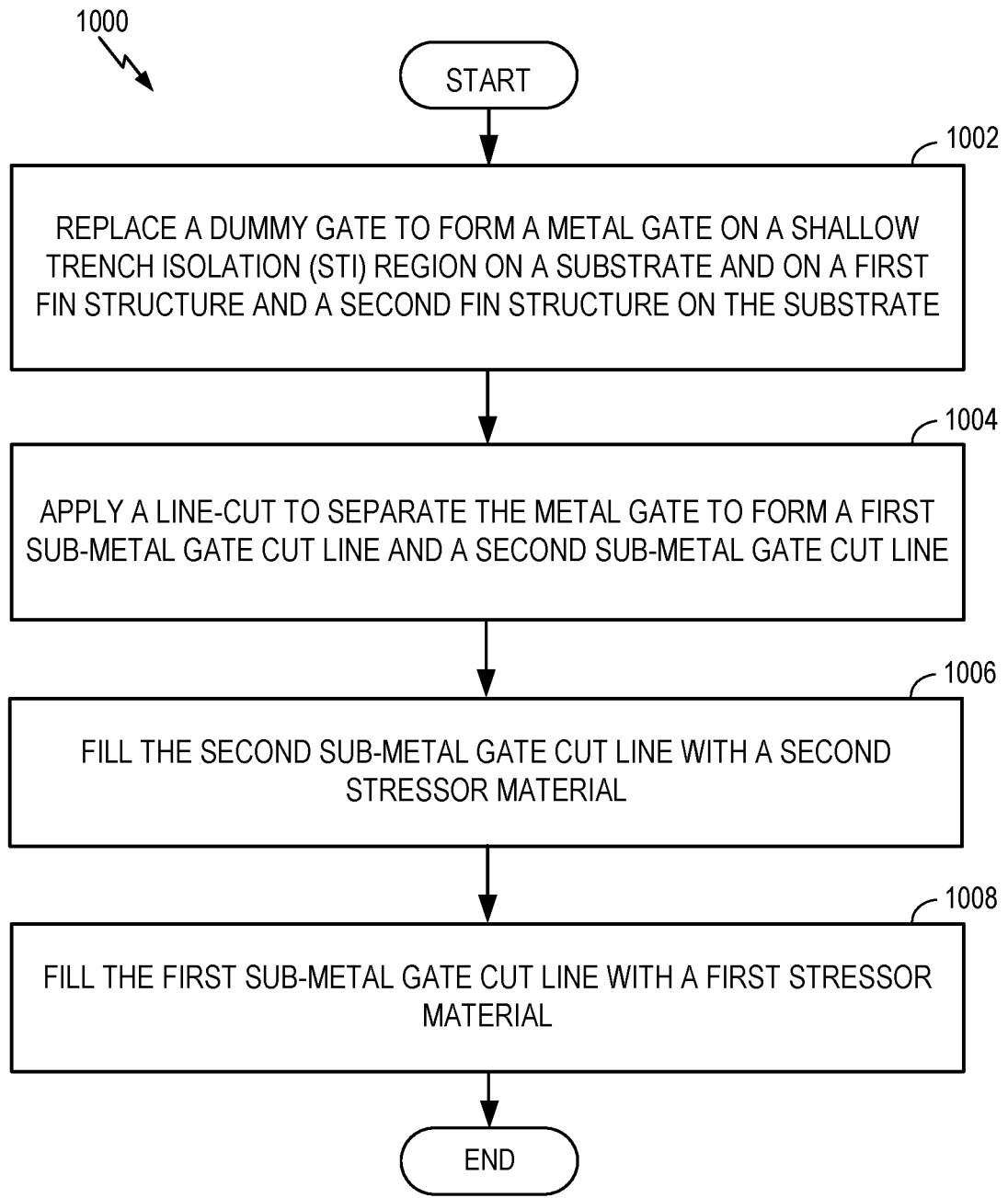

1000

START

1002

REPLACE A DUMMY GATE TO FORM A METAL GATE ON A SHALLOW TRENCH ISOLATION (STI) REGION ON A SUBSTRATE AND ON A FIRST FIN STRUCTURE AND A SECOND FIN STRUCTURE ON THE SUBSTRATE

1004

APPLY A LINE-CUT TO SEPARATE THE METAL GATE TO FORM A FIRST SUB-METAL GATE CUT LINE AND A SECOND SUB-METAL GATE CUT LINE

1006

FILL THE SECOND SUB-METAL GATE CUT LINE WITH A SECOND STRESSOR MATERIAL

1008

FILL THE FIRST SUB-METAL GATE CUT LINE WITH A FIRST STRESSOR MATERIAL

END

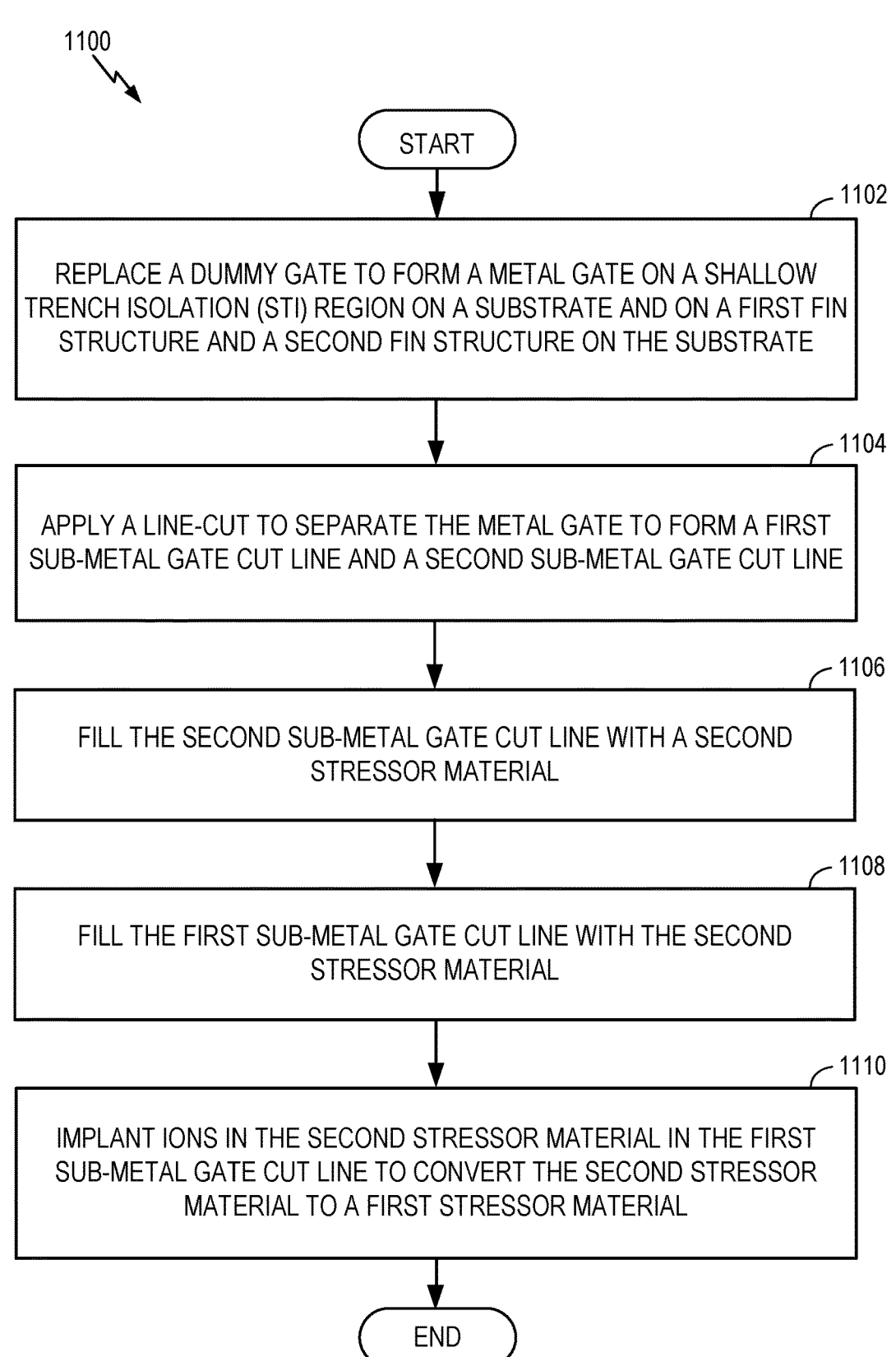

START

1102

REPLACE A DUMMY GATE TO FORM A METAL GATE ON A SHALLOW TRENCH ISOLATION (STI) REGION ON A SUBSTRATE AND ON A FIRST FIN STRUCTURE AND A SECOND FIN STRUCTURE ON THE SUBSTRATE

1104

APPLY A LINE-CUT TO SEPARATE THE METAL GATE TO FORM A FIRST SUB-METAL GATE CUT LINE AND A SECOND SUB-METAL GATE CUT LINE

1106

FILL THE SECOND SUB-METAL GATE CUT LINE WITH A SECOND STRESSOR MATERIAL

1108

FILL THE FIRST SUB-METAL GATE CUT LINE WITH THE SECOND STRESSOR MATERIAL

1110

IMPLANT IONS IN THE SECOND STRESSOR MATERIAL IN THE FIRST SUB-METAL GATE CUT LINE TO CONVERT THE SECOND STRESSOR MATERIAL TO A FIRST STRESSOR MATERIAL

END

FIG. 11

POST-REPLACEMENT METAL GATE (RMG) GATE CUT FOR PERFORMANCE ENHANCED FINFET

BACKGROUND

Field

Aspects of the present disclosure relate to semiconductor devices and, more particularly, to an N/P-independently strained post-replacement metal gate (RMG) gate cut for performance enhanced fin-based field effect transistor (Fin-FET) technologies.

Background

As integrated circuit (IC) technology advances, device geometries are reduced. Technological advances in IC materials and design produced generations of ICs in which each generation has smaller and more complex circuits than the previous generation. In the course of IC evolution, functional density has generally increased while geometry size has decreased. This scaling down process provides benefits by increasing production efficiency and lowering associated costs. Such scaling down also increases the complexity of processing and manufacturing ICs. Moreover, realizing these advancements involves similar developments in IC processing and manufacturing.

One advancement implemented as technology nodes shrink, in some IC designs, is the replacement of the polysilicon gate electrode with a metal gate electrode to improve device performance with the decreased feature sizes. Although existing methods of fabricating IC devices are generally adequate for their intended purposes, they are not entirely satisfactory in all respects. For example, fin-based devices are three-dimensional structures on the surface of a semiconductor substrate. A fin-based field effect transistor (FET) may be referred to as a FinFET.

Advanced logic complementary metal oxide semiconductor (CMOS) scaling for FinFET technologies achieves a performance-power-area (PPA) boost over past process nodes. Unfortunately, further FinFET transistor mobility in sub-seven nanometer (nm) process nodes is difficult because conventional strain boosters are reaching their limit. Therefore, a new strain booster for continuous FinFET device performance improvement is desired.

SUMMARY

A fin field effect transistor (FinFET) is described. The FinFET includes a substrate and a shallow trench isolation (STI) region on the substrate. The FinFET also includes a first fin structure on the substrate and extending through the STI region. The FinFET further includes a second fin structure on the substrate and extending through the STI region. The FinFET also includes a metal gate on the STI region, on the first fin structure, and on the second fin structure. The metal gate is composed of a first sub-metal gate cut line filled with a first stressor material, and a second sub-metal gate cut line filled with a second stressor material different from the first stressor material.

A method is described. The method includes replacing a dummy gate to form a metal gate on a shallow trench isolation (STI) region on a substrate, and on a first fin structure and a second fin structure on the substrate. The method also includes applying a line-cut to separate the metal gate to form a first sub-metal gate cut line and a second sub-metal gate cut line. The method further includes filling the first sub-metal gate cut line with a first stressor material. The method also includes filling the second sub-metal gate cut line with a second stressor material different from the first stressor material.

A method is described. The method includes replacing a dummy gate to form a metal gate on a shallow trench isolation (STI) region on a substrate and on a first fin structure and a second fin structure on the substrate. The method also includes applying a line-cut to separate the metal gate to form a first sub-metal gate cut line and a second sub-metal gate cut line. The method further includes filling the first sub-metal gate cut line and the second sub-metal gate cut line with a first stressor material. The method also includes implanting ions in the first stressor material in the second sub-metal gate cut line to convert the first stressor material to a second stressor material that is different from the first stressor material.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

FIG. 3 illustrates a cross-sectional view of a metal oxide semiconductor field effect transistor (MOSFET) device.

FIG. 7 is a flowchart illustrating a method of forming a fin field effect transistor (FinFET) having independently strained N-type and P-type regions, according to some aspects of the present disclosure.

FIGS. 8A-8I are schematic diagrams illustrating a process for forming a fin field effect transistor (FinFET) having independently strained N-type and P-type regions, according to some aspects of the present disclosure.

FIGS. 9A-9G are schematic diagrams illustrating a process for forming a fin field effect transistor (FinFET) having independently strained N-type and P-type regions using ion implantation, according to some aspects of the present disclosure.

FIG. 10 is a process flow diagram illustrating a method of fabricating a field effect transistor (FET) having independently strained N-type and P-type regions, according to aspects of the present disclosure.

FIG. 11 is a process flow diagram illustrating a method of fabricating a field effect transistor (FET) having independently strained N-type and P-type regions, according to aspects of the present disclosure.

DETAILED DESCRIPTION

Figure 1:
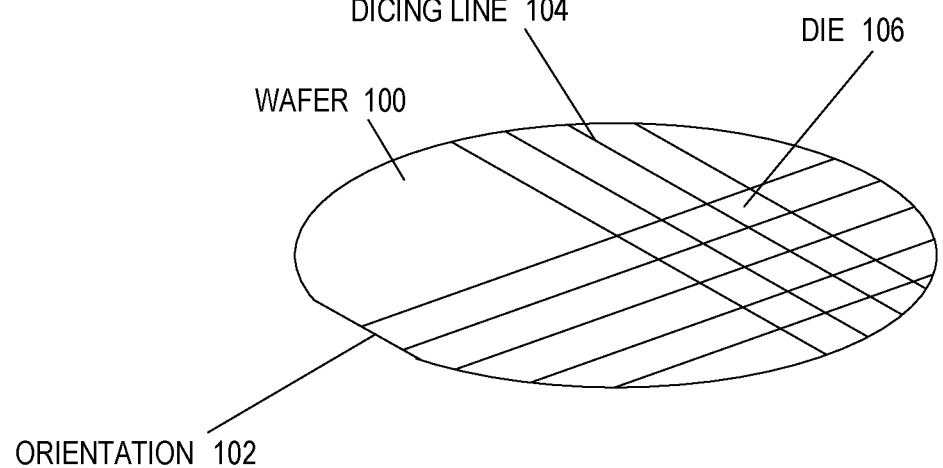
FIG. 1 illustrates a perspective view of a semiconductor wafer.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. As described herein, the term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

As integrated circuit (IC) technology advances, device geometries are reduced. Technological advances in IC materials and design produced generations of ICs in which each generation has smaller and more complex circuits than the previous generation. In the course of IC evolution, functional density has generally increased while geometry size has decreased. This scaling down process provides benefits by increasing production efficiency and lowering associated costs. Such scaling down has also increased the complexity of processing and manufacturing ICs. Realizing these advancements involves similar developments in IC processing and manufacturing.

Fin-based devices represent a significant advance in IC technology over planar-based devices. Fin-based devices are three-dimensional structures on the surface of a semiconductor substrate. A fin field effect transistor (FinFET) is a fin-based metal oxide semiconductor field effect transistor (MOSFET). A nanowire FET also represents a significant advance in IC technology. A gate-all-around (GAA) nanowire-based device is another three-dimensional structure on the surface of a semiconductor substrate. Other fin-based devices include omega-gate devices as well as pi-gate devices. A fin-based field effect transistor may be referred to as a FinFET device.

One advancement implemented as technology nodes shrink, in some IC designs, is the replacement of the polysilicon gate electrode with a metal gate electrode to improve device performance with the decreased feature sizes. Although existing methods of fabricating IC devices are generally adequate for their intended purposes, the methods are not entirely satisfactory in all respects. For example, the fin-based devices may be implemented using replacement metal gate (RMG) technology.

Advanced logic complementary metal oxide semiconductor (CMOS) scaling for fin-based devices implemented with RMG technology achieves a performance-power-area (PPA) boost over past process nodes. Unfortunately, further fin-based transistor mobility in sub-seven nanometer (nm) process nodes is difficult because conventional strain boosters are reaching their limit. Therefore, a new strain booster for continuous fin-based transistor performance improvement is desired.

Various aspects of the present disclosure are directed to independently strained N-type metal oxide semiconductor (NMOS) and P-type metal oxide semiconductor (PMOS) regions of a fin-based device post-replacement metal gate (RMG) gate cut for a performance enhancement in fin-based field effect transistor (FinFET) technologies. The process flow for fabricating the FinFET device having independently strained NMOS and PMOS regions may include front-end-of-line (FEOL) processes, middle-of-line (MOL) processes, and back-end-of-line (BEOL) processes. It will be understood that the term "layer" includes film and is not to be construed as indicating a vertical or horizontal thickness unless otherwise stated. As described herein, the term "substrate" may refer to a substrate of a diced wafer or may refer to the substrate of a wafer that is not diced. Similarly, the terms "wafer" and "die" may be used interchangeably unless such interchanging would tax credulity.

According to aspects of the present disclosure, a fin field effect transistor (FinFET) having independently strained N-type and P-type regions is described. The FinFET includes a substrate having a shallow trench isolation (STI) region on the substrate. The FinFET also includes a first fin structure on the substrate and extending through the STI region, and a second fin structure on the substrate and extending through the STI region. The FinFET further includes a metal gate on the STI region, on the first fin structure, and on the second fin structure. In some aspects of the present disclosure, the metal gate is composed of a first sub-metal gate cut line filled with a first stressor material, and a second sub-metal gate cut line filled with a second stressor material different from the first stressor material.

FIG. 1 illustrates a perspective view of a semiconductor wafer, which may be used for fabricating a FinFET having independently strained N-type and P-type regions, according to aspects of the present disclosure. A wafer 100 may be a semiconductor wafer, or may be a substrate material with one or more layers of semiconductor material on a surface of the wafer 100. When the wafer 100 is a semiconductor material, it may be grown from a seed crystal using the Czochralski process, where the seed crystal is dipped into a molten bath of semiconductor material and slowly rotated and removed from the bath. The molten material then crystalizes onto the seed crystal in the orientation of the crystal.

The wafer 100 may be a single material (e.g., silicon (Si), germanium (Ge)) or a compound material, such as gallium arsenide (GaAs), gallium nitride (GaN), or indium phosphide (InP), a ternary material such as indium gallium arsenide (InGaAs), quaternary materials, or any material that can be a substrate material for other semiconductor materials. Although many of the materials may be crystalline in nature, polycrystalline or amorphous materials may also be used for the wafer 100.

The wafer 100, or layers that are coupled to the wafer 100, may be supplied with materials that make the wafer 100 more conductive. For example, and not by way of limitation, a silicon wafer may have phosphorus or boron added to the wafer 100 to allow for electrical charge to flow in the wafer 100. These additives are referred to as dopants, and provide extra charge carriers (either electrons or holes) within the wafer 100 or portions of the wafer 100. By selecting the areas where the extra charge carriers are provided, which type of charge carriers are provided, and the amount (density) of additional charge carriers in the wafer 100, different types of electronic devices may be formed in or on the wafer 100.

The wafer 100 has an orientation 102 that indicates the crystalline orientation of the wafer 100. The orientation 102 may be a flat edge of the wafer 100 as shown in FIG. 1, or may be a notch or other indicia to illustrate the crystalline orientation of the wafer 100. The orientation 102 may indicate the Miller Indices for the planes of the crystal lattice in the wafer 100.

The Miller Indices form a notation system of the crystallographic planes in crystal lattices. The lattice planes may be indicated by three integers h, k, and l, which are the Miller indices for a plane (hkl) in the crystal. Each index denotes a plane orthogonal to a direction (h, k, l) on the basis of the reciprocal lattice vectors. The integers are usually written in lowest terms (e.g., their greatest common divisor should be 1). Miller index 100 represents a plane orthogonal to direction h; index 010 represents a plane orthogonal to direction k, and index 001 represents a plane orthogonal to f. For some crystals, negative numbers are used (written as a bar over the index number) and for some crystals, such as gallium nitride, more than three numbers may be employed to adequately describe the different crystallographic planes.

Once the wafer 100 has been processed as desired, the wafer 100 is divided up along dicing lines 104. The dicing lines 104 indicate where the wafer 100 is to be broken apart or separated into pieces. The dicing lines 104 may define the outline of the various integrated circuits that have been fabricated on the wafer 100.

Once the dicing lines 104 are defined, the wafer 100 may be sawn or otherwise separated into pieces to form die 106. Each of the die 106 may be an integrated circuit with many devices or may be a single electronic device. The physical size of the die 106, which may also be referred to as a chip or a semiconductor chip, depends at least in part on the ability to separate the wafer 100 into certain sizes, as well as the number of individual devices that the die 106 is designed to contain.

Once the wafer 100 has been separated into one or more die 106, the die 106 may be mounted into packaging to allow access to the devices and/or integrated circuits fabricated on the die 106. Packaging may include single in-line packaging, dual in-line packaging, motherboard packaging, flip-chip packaging, indium dot/bump packaging, or other types of devices that provide access to the die 106. The die 106 may also be directly accessed through wire bonding, probes, or other connections without mounting the die 106 into a separate package.

Figure 2:
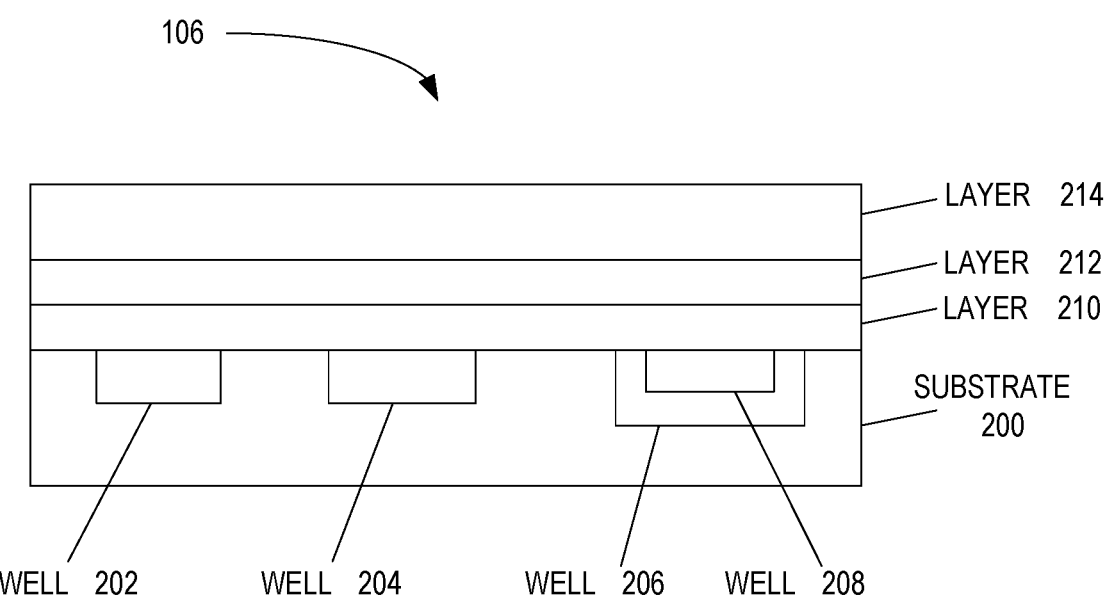
FIG. 2 illustrates a cross-sectional view of a die.

FIG. 2 illustrates a cross-sectional view of the die 106 of FIG. 1, which may be used for fabricating a FinFET having independently strained N-type and P-type regions, according to aspects of the present disclosure. In the die 106, there may be a substrate 200, which may be a semiconductor material and/or may act as a mechanical support for electronic devices. The substrate 200 may be a doped semiconductor substrate, which has either electrons (designated N-channel) or holes (designated P-channel) charge carriers present throughout the substrate 200. Subsequent doping of the substrate 200 with charge carrier ions/atoms may change the charge carrying capabilities of the substrate 200.

Within the substrate 200 (e.g., a semiconductor substrate), there may be wells 202 and 204 of a field effect transistor (FET), or wells 202 and/or 204 may be fin structures of a fin structured FET (FinFET). Wells 202 and/or 204 may also be other devices (e.g., a resistor, a capacitor, a diode, or other electronic devices) depending on the structure and other characteristics of the wells 202 and/or 204 and the surrounding structure of the substrate 200.

The semiconductor substrate may also have a well 206 and a well 208. The well 208 may be completely within the well 206, and, in some cases, may form a bipolar junction transistor (BJT). The well 206 may also be used as an isolation well to isolate the well 208 from electric and/or magnetic fields within the die 106.

Layers (e.g., 210 through 214) may be added to the die 106. The layer 210 may be, for example, an oxide or insulating layer that may isolate the wells (e.g., 202-208) from each other or from other devices on the die 106. In such cases, the layer 210 may be silicon dioxide, a polymer, a dielectric, or another electrically insulating layer. The layer 210 may also be an interconnection layer, in which case it may comprise a conductive material such as copper, tungsten, aluminum, an alloy, or other conductive or metallic materials.

The layer 212 may also be a dielectric or conductive layer, depending on the desired device characteristics and/or the materials of the layers (e.g., 210 and 214). The layer 214 may be an encapsulating layer, which may protect the layers (e.g., 210 and 212), as well as the wells 202-208 and the substrate 200, from external forces. For example, and not by way of limitation, the layer 214 may be a layer that protects the die 106 from mechanical damage, or the layer 214 may be a layer of material that protects the die 106 from electromagnetic or radiation damage.

Electronic devices designed on the die 106 may comprise many features or structural components. For example, the die 106 may be exposed to any number of methods to impart dopants into the substrate 200, the wells 202-208, and, if desired, the layers (e.g., 210-214). For example, and not by way of limitation, the die 106 may be exposed to ion implantation, deposition of dopant atoms that are driven into a crystalline lattice through a diffusion process, chemical vapor deposition, epitaxial growth, or other methods. Through selective growth, material selection, and removal of portions of the layers (e.g., 210-214), and through selective removal, material selection, and dopant concentration of the substrate 200 and the wells 202-208, many different structures and electronic devices may be formed within the scope of the present disclosure.

Further, the substrate 200, the wells 202-208, and the layers (e.g., 210-214) may be selectively removed or added through various processes. Chemical wet etching, chemical mechanical planarization (CMP), plasma etching, photoresist masking, damascene processes, and other methods may create the structures and devices of the present disclosure.

FIG. 3 illustrates a cross-sectional view of a metal oxide semiconductor field effect transistor (MOSFET) device 300. The MOSFET device 300 may have four input terminals. The four inputs are a source 302, a gate 304, a drain 306, and a body. The source 302 and the drain 306 may be fabricated as the wells 202 and 204 in a substrate 308, or may be fabricated as areas above the substrate 308, or as part of other layers on the die 106. Such other structures may be a fin or other structure that protrudes from a surface of the substrate 308. Further, the substrate 308 may be the substrate 200 on the die 106, but the substrate 308 may also be one or more of the layers (e.g., 210-214) that are coupled to the substrate 200.

The MOSFET device 300 is a unipolar device, as electrical current is produced by only one type of charge carrier (e.g., either electrons or holes) depending on the type of MOSFET. The MOSFET device 300 operates by controlling the amount of charge carriers in the channel 310 between the source 302 and the drain 306. A voltage Vsource 312 is applied to the source 302, a voltage Vgate 314 is applied to the gate 304, and a voltage Vdrain 316 is applied to the drain 306. A separate voltage Vsubstrate 318 may also be applied to the substrate 308, although the voltage Vsubstrate 318 may be coupled to one of the voltage Vsource 312, the voltage Vgate 314, or the voltage Vdrain 316.

To control the charge carriers in the channel 310, the voltage Vgate 314 creates an electric field in the channel 310 when the gate 304 accumulates charges. The opposite charge to that accumulating on the gate 304 begins to accumulate in the channel 310. The gate insulator 320 insulates the charges accumulating on the gate 304 from the source 302, the drain 306, and the channel 310. The gate 304 and the channel 310, with the gate insulator 320 in between, create a capacitor, and as the voltage Vgate 314 increases, the charge carriers on the gate 304, acting as one plate of this capacitor, begin to accumulate. This accumulation of charges on the gate 304 attracts the opposite charge carriers into the channel 310. Eventually, enough charge carriers are accumulated in the channel 310 to provide an electrically conductive path between the source 302 and the drain 306. This condition may be referred to as opening the channel of the FET.

By changing the voltage Vsource 312 and the voltage Vdrain 316, and their relationship to the voltage Vgate 314, the amount of voltage applied to the gate 304 that opens the channel 310 may vary. For example, the voltage Vsource 312 is usually of a higher potential than that of the voltage Vdrain 316. Making the voltage differential between the voltage Vsource 312 and the voltage Vdrain 316 larger will change the amount of the voltage Vgate 314 used to open the channel 310. Further, a larger voltage differential will change the amount of electromotive force moving charge carriers through the channel 310, creating a larger current through the channel 310.

The gate insulator 320 material may be silicon oxide, or may be a dielectric or other material with a different dielectric constant (k) than silicon oxide. Further, the gate insulator 320 may be a combination of materials or different layers of materials. For example, the gate insulator 320 may be Aluminum Oxide, Hafnium Oxide, Hafnium Oxide Nitride, Zirconium Oxide, or laminates and/or alloys of these materials. Other materials for the gate insulator 320 may be used without departing from the scope of the present disclosure.

By changing the material for the gate insulator 320, and the thickness of the gate insulator 320 (e.g., the distance between the gate 304 and the channel 310), the amount of charge on the gate 304 to open the channel 310 may vary. A symbol 322 showing the terminals of the MOSFET device 300 is also illustrated. For N-channel MOSFETs (using electrons as charge carriers in the channel 310), an arrow is applied to the substrate 308 terminal in the symbol 322 pointing away from the gate 304 terminal. For P-type MOSFETs (using holes as charge carriers in the channel 310), an arrow is applied to the substrate 308 terminal in the symbol 322 pointing toward the gate 304 terminal.

In some MOSFET designs, a high-k value material may be desired in the gate insulator 320, and in such designs, other conductive materials may be employed. For example, and not by way of limitation, a "high-k metal gate" design may employ a metal, such as copper, for the gate 304 terminal. Although referred to as "metal," polycrystalline materials, alloys, or other electrically conductive materials are contemplated as appropriate materials for the gate 304, as described below.

To interconnect to the MOSFET device 300, or to interconnect to other devices in the die 106 (e.g., semiconductor), interconnect traces or layers are used. These interconnect traces may be in one or more layers (e.g., 210-214), or may be in other layers of the die 106.

Figure 4:
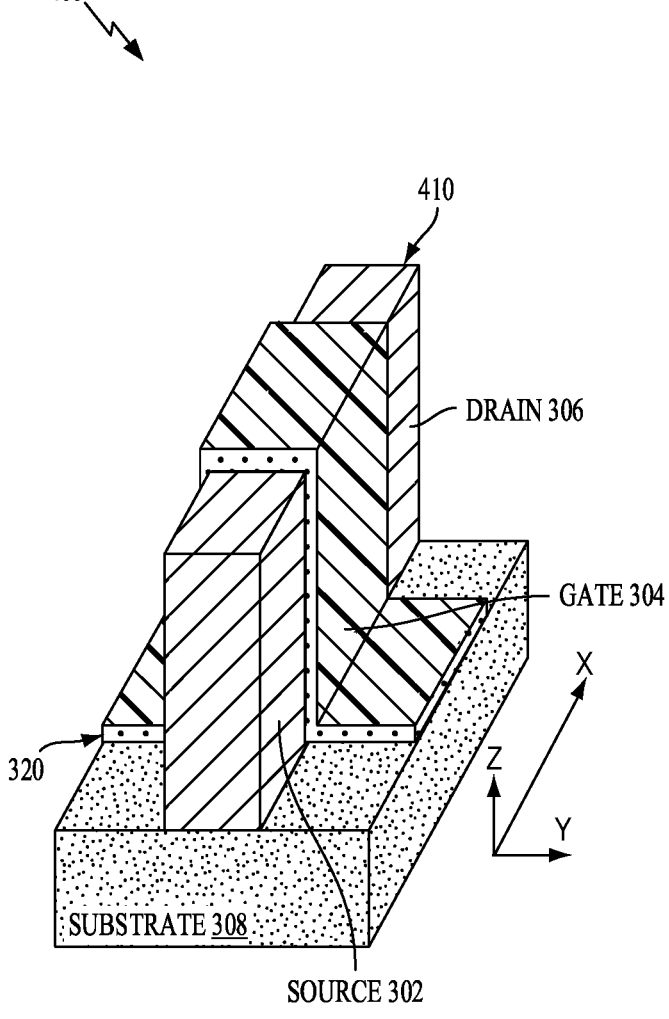
FIG. 4 illustrates a vertical fin field effect transistor (FinFET).

FIG. 4 illustrates a vertical fin-structured field effect transistor (FinFET) 400 that operates in a similar fashion to the MOSFET device 300 described with respect to FIG. 3. A fin 410 in the FinFET 400, however, is grown or otherwise coupled to the substrate 308 of FIG. 3. The substrate 308 may be a semiconductor substrate or other like supporting layer, for example, comprised of an oxide layer, a nitride layer, a metal oxide layer, or a silicon layer. The fin 410 includes the source 302 and the drain 306. A gate 304 is disposed on the fin 410 and on the substrate 308 through a gate insulator 320. In a FinFET structure, the physical size of the FinFET 400 may be smaller than the MOSFET device 300 structure shown in FIG. 3. This reduction in physical size allows for more devices per unit area on the die 106.

The FinFET 400 may be fabricated through processes including a front-end-of-line (FEOL), a middle-of-line (MOL) and a back-end-of-line (BEOL). An MOL process includes gate and terminal contact formation. An MOL layer trench contacts the source and drain regions of the FinFET 400 and is referred to as CA contacts.

Fin-based devices, such as the FinFET 400, represent a significant advance in integrated circuit (IC) technology over planar-based devices. Fin-based devices are three-dimensional structures on the surface of a semiconductor substrate. A FinFET transistor is a fin-based metal oxide semiconductor field effect transistor (MOSFET). A nanowire FET also represents a significant advance in IC technology. A gate-all-around (GAA) nanowire-based device is another three-dimensional structure on the surface of a semiconductor substrate. Other fin-based devices include omega-gate devices as well as pi-gate devices. A fin-based field effect transistor may be referred to as a FinFET device.

One advancement implemented as technology nodes shrink, in some IC designs, is the replacement of the polysilicon gate electrode with a metal gate electrode to improve device performance with the decreased feature sizes. Although existing methods of fabricating IC devices are generally adequate for their intended purposes, they are not entirely satisfactory in all respects. For example, the fin-based devices may be implemented using replacement metal gate (RMG) technology.

Advanced logic complementary metal oxide semiconductor (CMOS) scaling for fin-based devices implemented with RMG technology achieves a performance-power-area (PPA) boost over past process nodes. Unfortunately, further fin-based transistor mobility in sub-seven nanometer (nm) process nodes is difficult because conventional strain boosters are reaching their limit. Therefore, a new strain booster for continued fin-based transistor performance improvement is desired.

TABLE I

| Preferred Strain Types | | | |
| --- | --- | --- | --- |
| | Direction | NMOS electrons | PMOS holes |
| X | length direction (carrier S → D) | T | C |
| Y | width direction | T | T |
| Z | from body to gate | C | T |

As an example, Table I lists preferred strain types according to the X-direction, Y-direction, and Z-direction, as shown in FIG. 4. In the X-direction (e.g., a length direction from the source 302 to the drain 306) a tensile (T) strain is preferred for the NMOS electrons and a compressive (C) strain is preferred from the PMOS holes. In the Y-direction (e.g., the width direction) a tensile (T) strain is preferred for both the NMOS electrons and the PMOS holes. In the Z-direction (e.g., from a body to the gate 304) a compressive (C) strain is preferred for the NMOS electrons and a tensile (T) strain is preferred from the PMOS holes. According to aspects of the present disclosure, a FinFET having independently strained N-type regions and P-type regions formed during a post-replacement metal gate (RMG) gate cut process is described, for example, as shown in FIGS. 5A-5B.

Figure 5A:
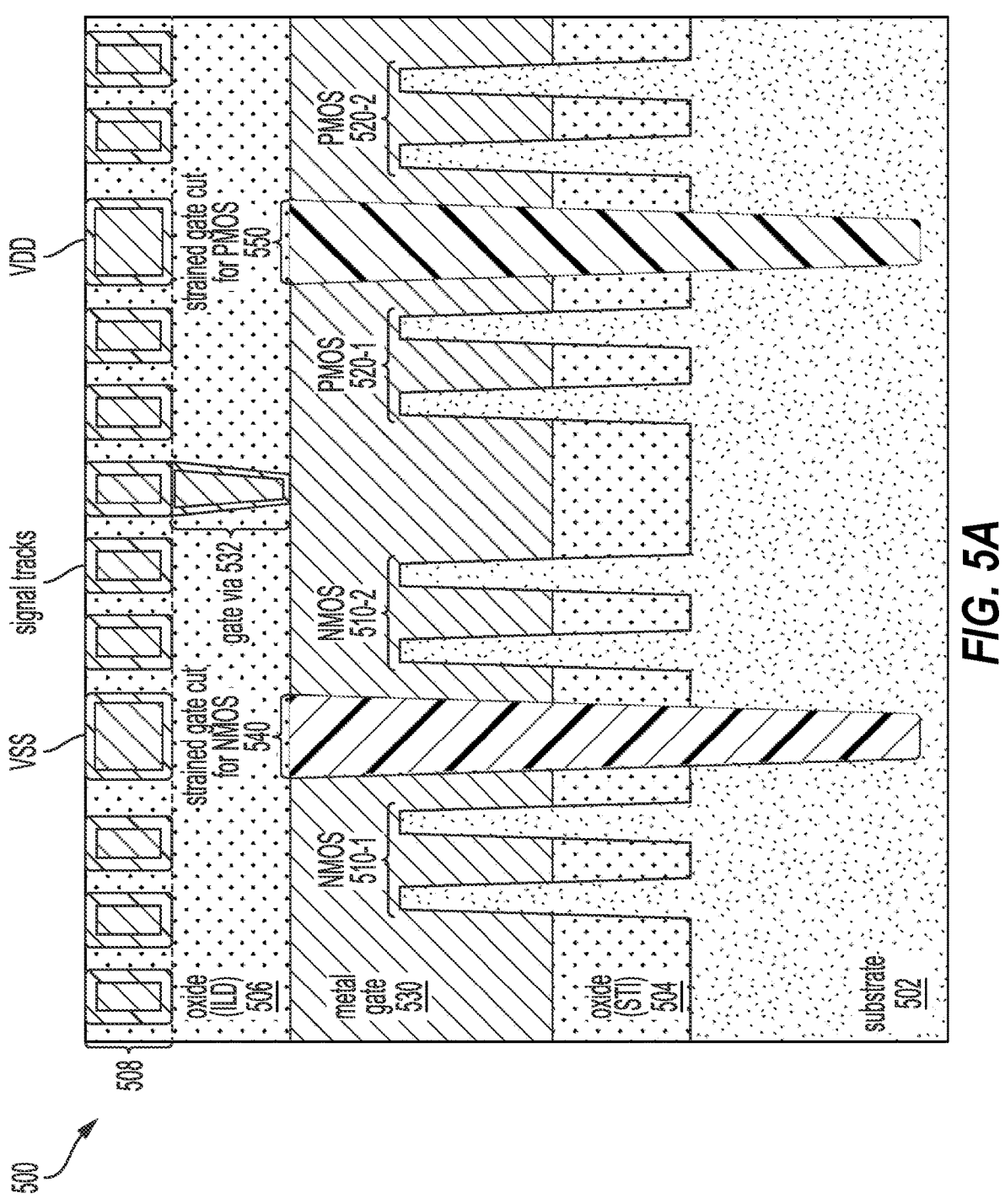
FIGS. 5A-5B are schematic diagrams illustrating integrated circuits including fin field effect transistors (FinFETs) having independently strained N-type and P-type regions, according to some aspects of the present disclosure.
Figure 5B:
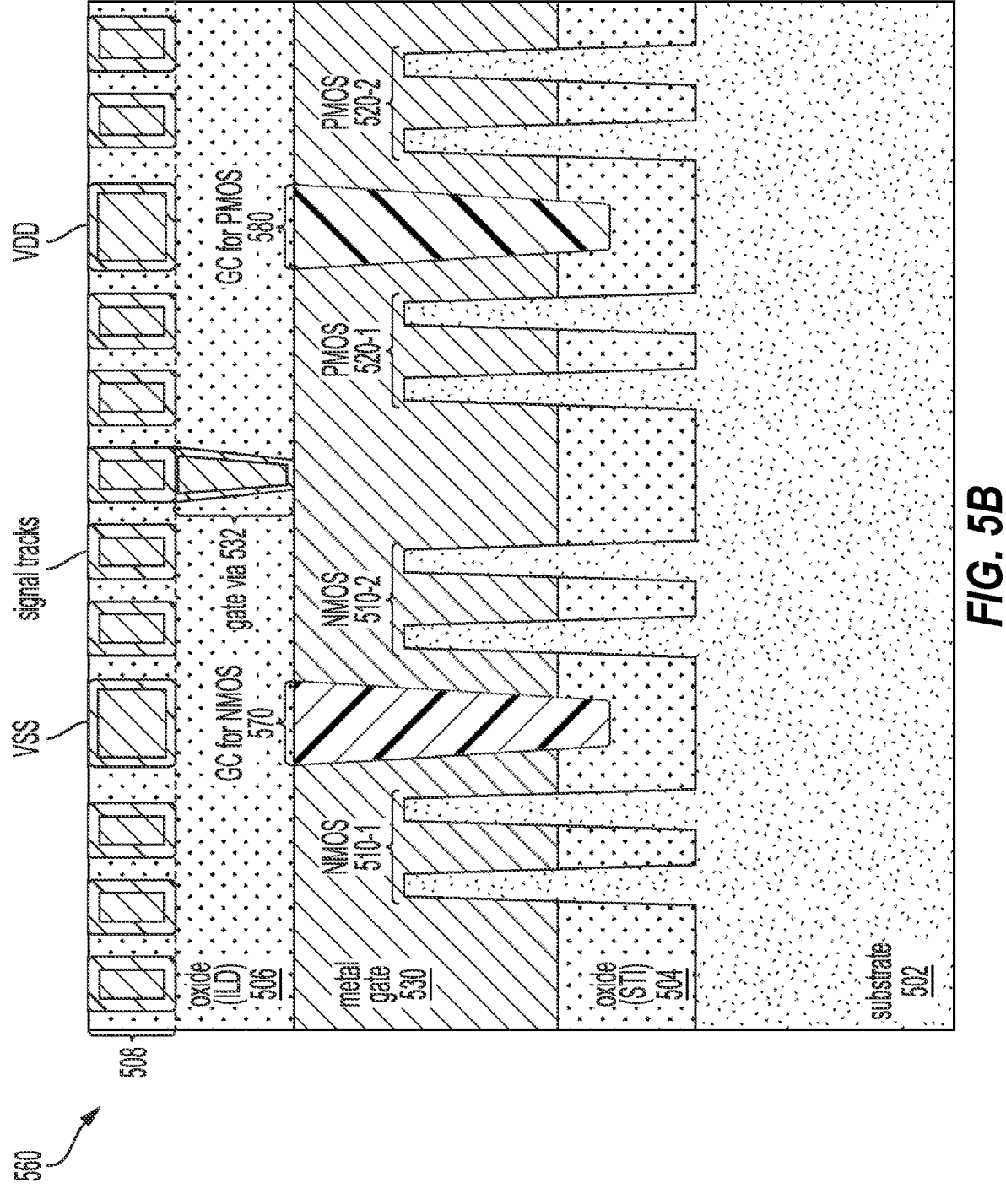

FIGS. 5A-5B are schematic diagrams illustrating an integrated circuit including a fin field effect transistor (FinFET) 500 having independently strained N-type and P-type regions, according to some aspects of the present disclosure. In this configuration, the FinFET 500 includes a substrate 502 having a shallow trench isolation (STI) region 504 on the substrate 502. In some aspects of the present disclosure, the FinFET 500 includes a first fin structure 510 (510-1, 510-2) on the substrate 502 and extending through the STI region 504, and a second fin structure 520 (520-1, 520-2) on the substrate 502 and extending through the STI region 504.

In this example, the first fin structure 510 (510-1, 510-2) corresponds to an N-type (e.g., an N-type metal oxide semiconductor (NMOS)) region of the substrate 502. Similarly, the second fin structure 520 (520-1, 520-2) corresponds to a P-type (e.g., a P-type metal oxide semiconductor (PMOS)) region of the substrate 502. In some aspects of the present disclosure, an NMOS channel of the substrate 502 may be composed of silicon (Si), germanium (Ge), gallium arsenide (GaAs), indium GaAs (InGaAs), gallium nitride (GaN), graphene, molybdenum disulfide (MoS$_2$), and/or phosphorus. In these aspects of the present disclosure, a PMOS channel of the substrate 502 may be composed of silicon (Si), germanium (Ge), silicon germanium (SiGe), indium antimonide (InSb), graphene, molybdenum disulfide (MoS$_2$), and/or phosphorus.

As further illustrated in FIG. 5A, the FinFET 500 includes a metal gate 530 on the STI region 504, on the first fin structure 510 (510-1, 510-2), and on the second fin structure 520 (520-1, 520-2). In some aspects of the present disclosure, the metal gate 530 is composed of a first sub-metal gate cut line 540 filled with a first stressor material, and a second sub-metal gate cut line 550 filled with a second stressor material different from the first stressor material. In this example, the first sub-metal gate cut line 540 and the second sub-metal gate cut line 550 extend through the metal gate 530, through the STI region 504, and into the substrate 502.

As shown in FIG. 5A, the first sub-metal gate cut line 540 is coupled between a first N-type metal oxide semiconductor (NMOS) region (e.g., 510-1) and a second NMOS region (e.g., 510-2). Similarly, the second sub-metal gate cut line 550 is coupled between a first P-type metal oxide semiconductor (PMOS) region (e.g., 520-1) and a second PMOS region (e.g., 520-2). In some aspects of the present disclosure, the metal gate 530 is composed of tantalum (Ta), tantalum nitride (TaN), tantalum titanium (TaTi), titanium (Ti), titanium aluminide (TiAl), titanium aluminide carbon (TiAl:C), tungsten, nitride (W:N), platinum (Pt), and/or gold (Au).

In some aspects of the present disclosure, the first stressor material and the second stressor material are selected according to the type of region (e.g., NMOS/PMOS) and the direction (e.g., X/Y/Z) using Table I. In some aspects of the present disclosure, filling stressor materials with tensile and/or compressive strain for the gate cut trench include, but are not limited to, silicon dioxide (SiO$_2$) silicon dioxide fluorine (SiO$_2$:F), silicon dioxide nitrogen (SiO$_2$:N), silicon dioxide germanium (SiO$_2$:Ge), silicon oxynitride (SiON), silicon oxynitride fluorine (SiON:F), silicon oxynitride germanium (SiON:Ge), silicon nitride (SiN), silicon nitride germanium (SiN:Ge), hafnium oxide (HfO$_2$), hafnium zirconium oxide (HfZrO$_2$), zirconium oxide (ZrO$_2$), hafnium lanthanum oxide (HfLaO), lanthanum oxide (LaO$_2$), germanium oxide (GeOx), and/or silicon germanium oxide (SiGeOx). An interlayer dielectric (ILD) layer 506 is provided on the metal gate 530 to support signal tracks 508 coupled to the metal gate 530 through a gate via 532 and power rails (e.g., VDD and VSS).

FIG. 5B illustrates a FinFET 560 having a similar configuration to the FinFET 500 in FIG. 5A and described using similar reference numbers. The FinFET 560 includes substrate 502 having the STI region 504 on the substrate 502, and the first fin structure 510 (510-1, 510-2) on the N-type region of the substrate 502 and extending through the STI region 504. The FinFET 560 also includes the second fin structure 520 (520-1, 520-2) on the P-type region of the substrate 502 and extending through the STI region 504.

The FinFET 560 includes the metal gate 530 on the STI region 504, on the first fin structure 510 (510-1, 510-2), and on the second fin structure 520 (520-1, 520-2). In some aspects of the present disclosure, the metal gate 530 is composed of a first sub-metal gate cut line 570 filled with a first stressor material, and a second sub-metal gate cut line 580 filled with a second stressor material different from the first stressor material. In this example, the first sub-metal gate cut line 570 and the second sub-metal gate cut line 580 extend through the metal gate 530 and into the STI region 504. In these aspects of the present disclosure, the first sub-metal gate cut line 570 and the second sub-metal gate cut line 580 do not extend through the STI region 504 and into the substrate 502. The FinFET 560 also includes the ILD layer 506 on the metal gate 530 to support the signal tracks 508 coupled to the metal gate 530 through the gate via 532 and the power VDD and VSS power rails.

Figure 6:
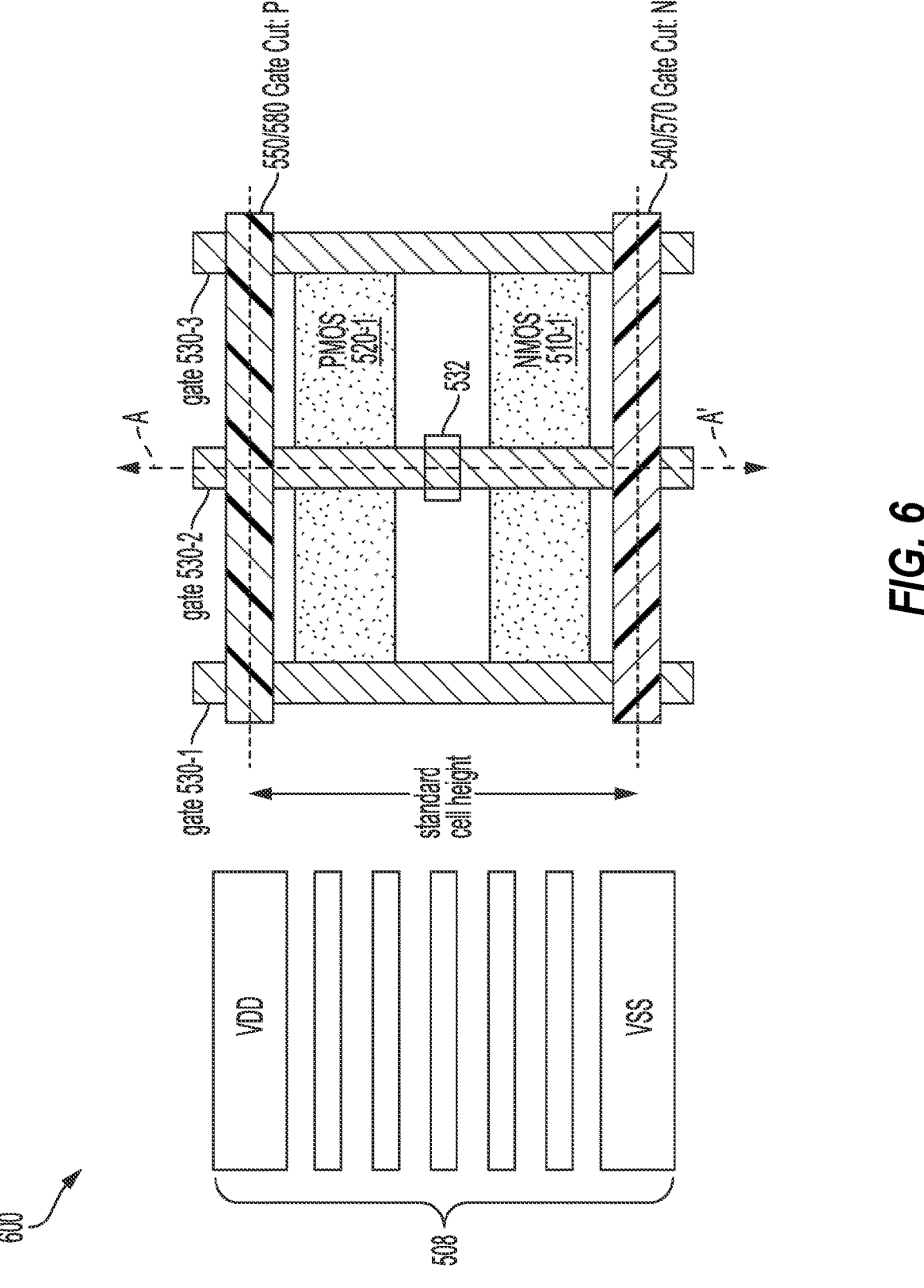
FIG. 6 illustrates a layout view of a fin field effect transistors (FinFET) having independently strained N-type and P-type regions, according to some aspects of the present disclosure.

FIG. 6 illustrates a layout view of a FinFET 600 having independently strained N-type and P-type regions, according to some aspects of the present disclosure. FIG. 6 illustrates the FinFET 600 having a similar configuration to the FinFET 500 in FIG. 5A and the FinFET 560 in FIG. 5B, and is described using similar reference numbers. In particular, the FinFET 500 shown in FIG. 5A and the FinFET 560 shown in FIG. 5B may be cross-sectional views along cut line AA' of the FinFET 600.

As shown in FIG. 6, the FinFET 600 includes the substrate 502 with a first fin structure 510-1 on an NMOS region. The FinFET 600 also includes a second fin structure 520-1 on a PMOS region of the FinFET 600. The FinFET 600 includes multiple metal gates 530 (530-1, 530-2, 530-3) on the first fin structure 510-1, and on the second fin structure 520-1. In some aspects of the present disclosure, the multiple metal gates 530 (530-1, 530-2, 530-3) are composed of a first sub-metal gate cut line 540/570 filled with a first stressor material, and a second sub-metal gate cut line 550/580 filled with a second stressor material different from the first stressor material. The first sub-metal gate cut line 540/570 and the second sub-metal gate cut line 550/580 extend through the multiple metal gates 530 (530-1, 530-2, 530-3). The gate via 532, the signal tracks 508, and the power VDD and VSS power rails are also shown.

FIG. 7 is a flowchart illustrating a method of forming a fin field effect transistor (FinFET) having independently strained N-type and P-type regions, according to some aspects of the present disclosure. A method 700 begins at block 702, in which fin/diffusion formation is performed. For example, as shown in FIG. 5A, a fin/diffusion formation process generates the first fin structure 510 (510-1, 510-2), corresponding to the NMOS region of the substrate 502. Similarly, the fin/diffusion formation process generates the second fin structure 520 (520-1, 520-2), corresponding to the PMOS region of the substrate 502.

At block 704, a dummy poly formation process is performed to form a dummy gate. At block 706, a source/drain (S/D) epitaxy process is performed to form source and drain regions. For example, as shown in FIG. 4, the S/D epitaxy process is performed to form the source 302 and the drain 306 of the FinFET 400. At block 708, a replacement metal gate (RMG) process is performed to replace a dummy poly gate with a metal gate. For example, as shown in FIG. 5A, the FinFET 500 further includes the metal gate 530 on the STI region 504, on the first fin structure 510 (510-1, 510-2), and on the second fin structure 520 (520-1, 520-2).

At block 710, a gate cut process is performed following the replacement metal gate (RMG) process of block 708. At block 712, contacts are formed. For example, as shown in FIG. 5A, the metal gate 530 is composed of a first sub-metal gate cut line 540 filled with a first stressor material, and a second sub-metal gate cut line 550 filled with a second stressor material different from the first stressor material. In this example, the first sub-metal gate cut line 540 and the second sub-metal gate cut line 550 extend through the metal gate 530, through the STI region 504 and into the substrate 502. In some aspects of the present disclosure, strains are incorporated in post-RMG gate cut (GC) dielectric material deposition. The strain may vary based on whether a region is an NMOS region or a PMOS region, for example, as shown in FIGS. 8A-8I. In some aspects of the present disclosure, the strain is incorporated along with ion-implantation on the post-RMG GC-filling dielectric material, for example, as shown in FIGS. 9A-9G.

FIGS. 8A-8I are schematic diagrams illustrating a process for forming a fin field effect transistor (FinFET) having independently strained N-type and P-type regions, according to some aspects of the present disclosure.

Figure 8A:
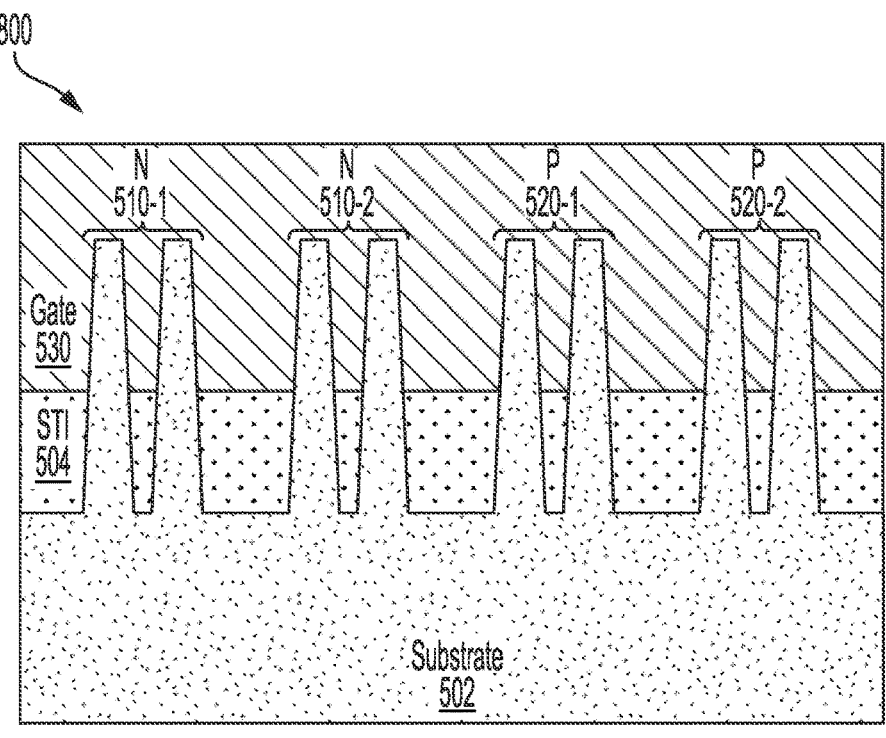

FIG. 8A illustrates a first step 800 in the process of forming the FinFET having independently strained N-type and P-type regions, according to some aspects of the present disclosure. In this process, an initial stage of the FinFET 500 of FIG. 5A is illustrated after a replacement metal gate (RMG) process to form the metal gate 530 on the first fin structure 510 (510-1, 510-2) and the second fin structure 520 (520-1, 520-2).

Figure 8B:
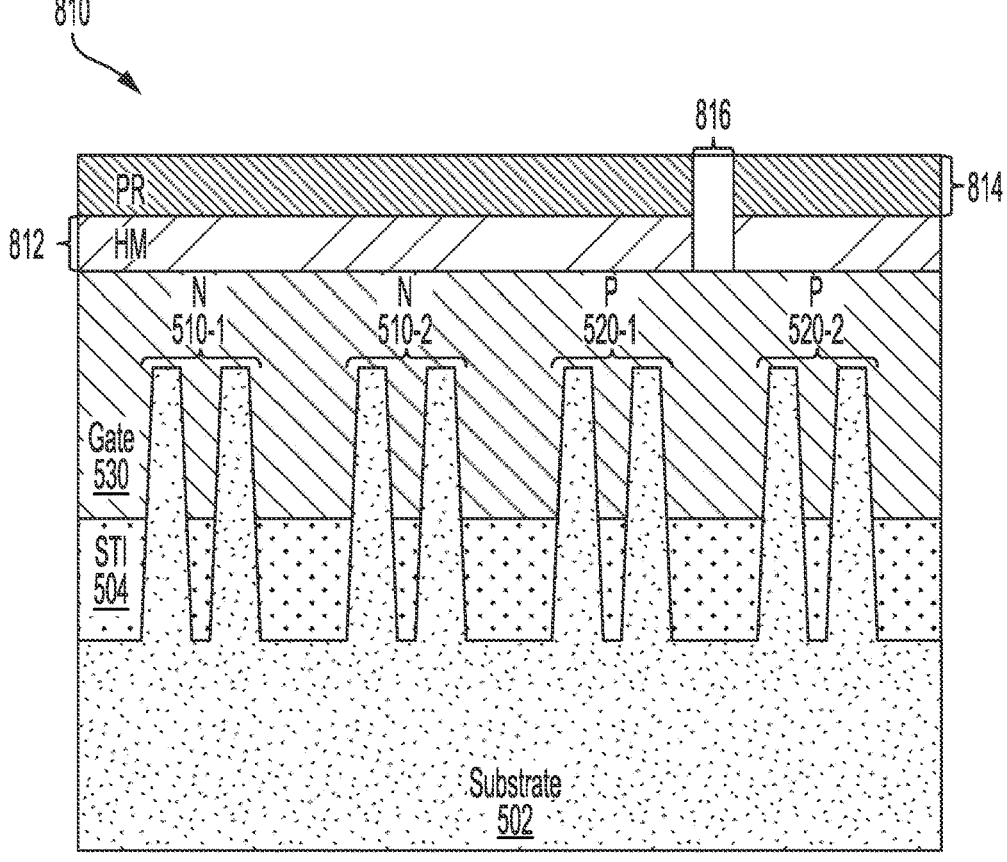

FIG. 8B illustrates a next step 810 in the process of forming the FinFET having independently strained N-type and P-type regions, according to some aspects of the present disclosure. At step 810, a hardmask (HM) 812 is deposited on a surface of the metal gate 530. Once the hardmask 812 is formed, a photoresist (PR) 814 is deposited on the hardmask 812. Following formation of the photoresist 814, the photoresist 814 and the hardmask 812 are patterned to form an opening 816 in preparation for performing a first gate-cut in the PMOS region of the substrate 502.

Figure 8C:
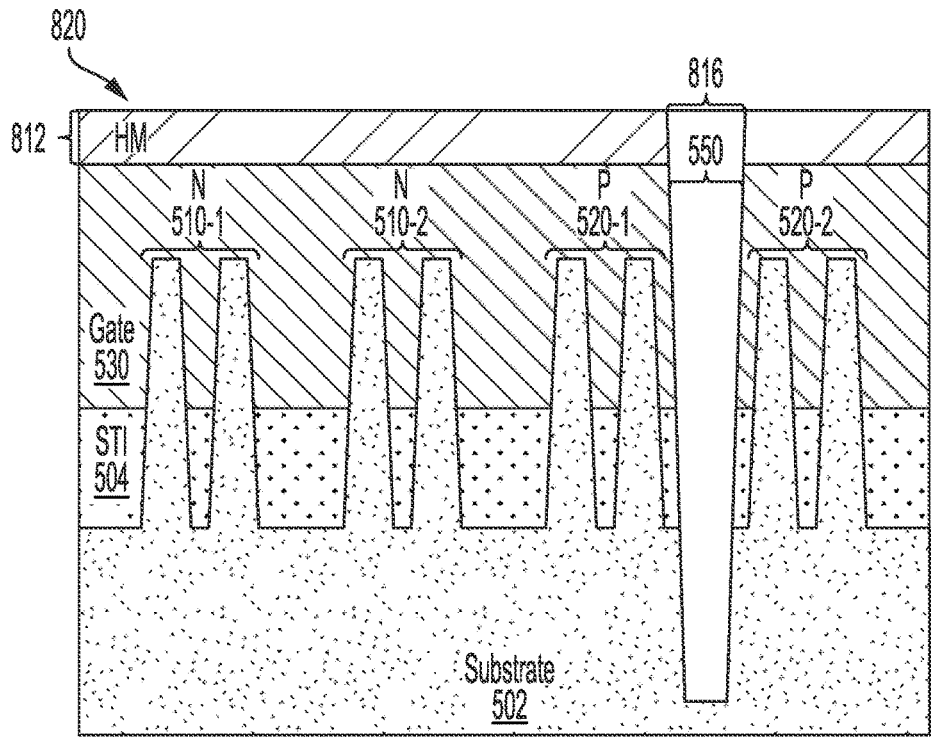

FIG. 8C illustrates a next step 820 in the process of forming the FinFET having independently strained N-type and P-type regions, according to some aspects of the present disclosure. At step 820, a gate-cut trench etch is performed following the opening 816 in the hardmask 812 and the photoresist 814. The second sub-metal gate cut line 550 is formed by etching through the metal gate 530, the STI region 504, and in the PMOS region of the substrate 502. In addition, the photoresist 814 is stripped to expose a surface of the hardmask 812.

Figure 8D:
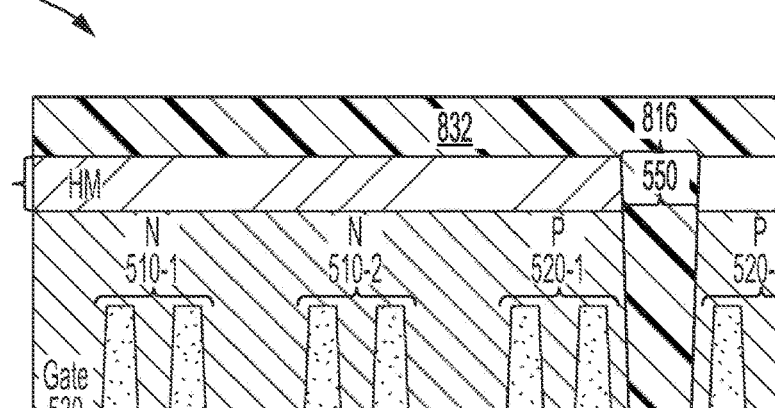

FIG. 8D illustrates a next step 830 in the process of forming the FinFET having independently strained N-type and P-type regions, according to some aspects of the present disclosure. At step 830, the second sub-metal gate cut line 550 is filled with a second stressor material 832, which is also deposited on the exposed surface of the hardmask 812. For example, as shown in FIGS. 5A and 8D, the second sub-metal gate cut line 550 is filled with the second stressor material 832 (shown in FIG. 8D), such as a post-RMG GC-filling P-type dielectric material through the metal gate 530, the STI region 504, in the PMOS region of the substrate 502, and on the surface of the hardmask 812.

Figure 8E:
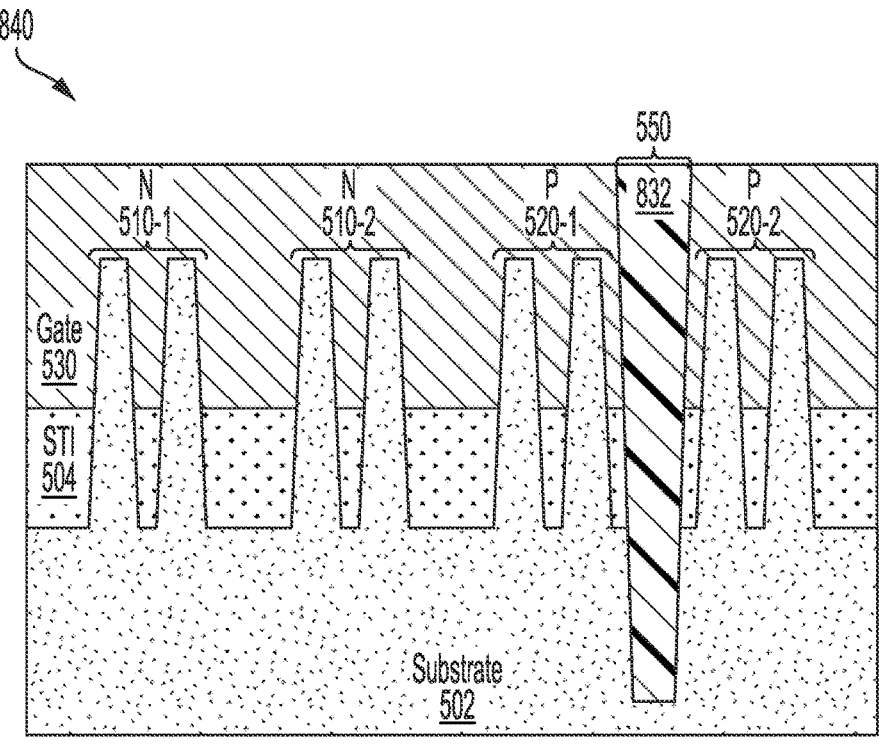

FIG. 8E illustrates a next step 840 in the process of forming the FinFET having independently strained N-type and P-type regions, according to some aspects of the present disclosure. At step 840, the second stressor material 832 and the hardmask 812 are stripped from the metal gate 530 using, for example, a chemical-mechanical-polishing (CMP) process. The CMP process of step 840 to strip the second stressor material 832 and the hardmask 812 from the metal gate 530 completes formation of the second sub-metal gate cut line 550 filled with the second stressor material 832.

Figure 8F:
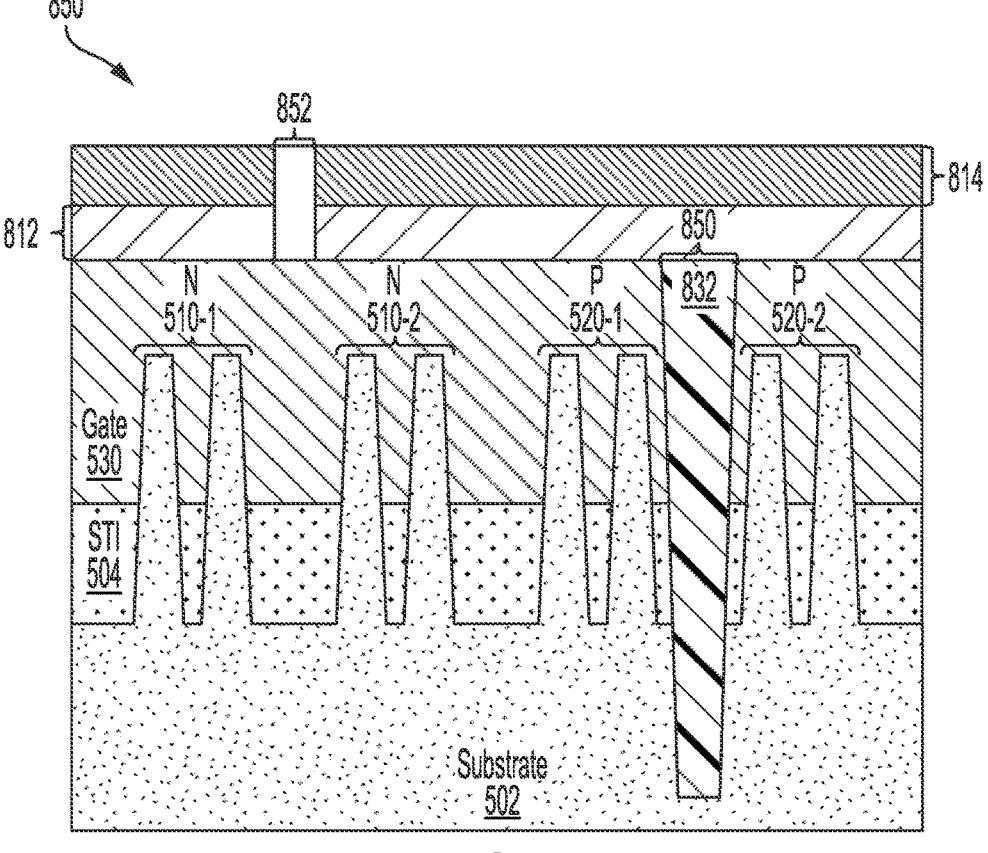

FIG. 8F illustrates a next step 850 in the process of forming the FinFET having independently strained N-type and P-type regions, according to some aspects of the present disclosure. At step 850, the hardmask 812 is deposited on the surface of the metal gate 530. Once the hardmask 812 is formed, the photoresist 814 is deposited on the hardmask 812. Following formation of the photoresist 814, the photoresist 814 and the hardmask 812 are patterned to form an opening 852 in preparation for performing a second gate-cut in the NMOS region of the substrate 502.

Figure 8G:
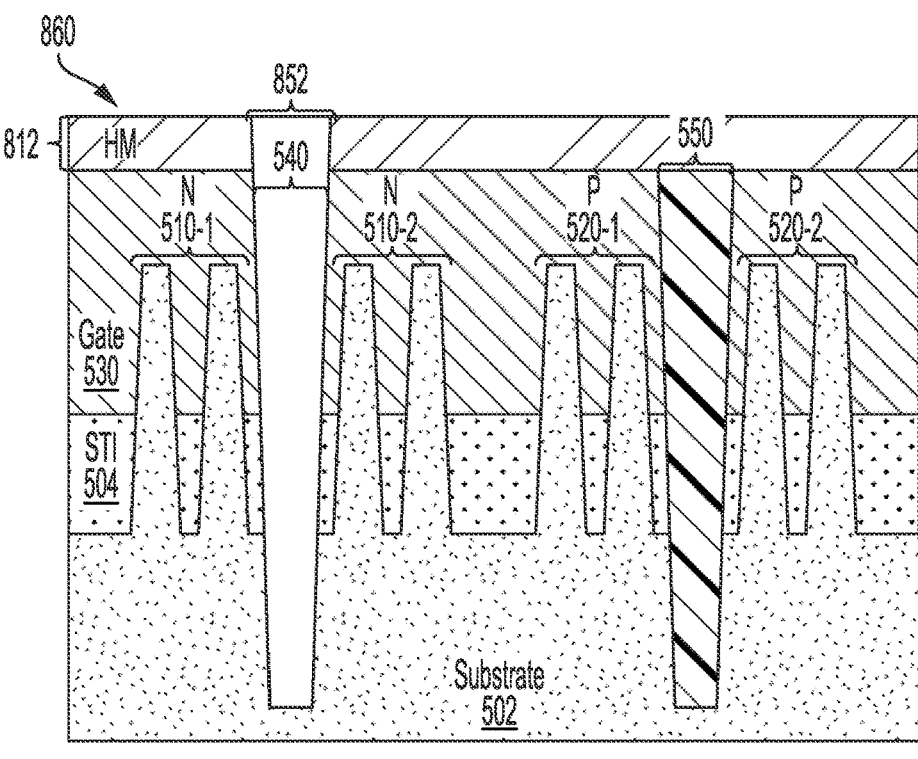

FIG. 8G illustrates a next step 860 in the process of forming the FinFET having independently strained N-type and P-type regions, according to some aspects of the present disclosure. At step 860, a gate-cut trench etch is performed following the opening 852 in the hardmask 812 and the photoresist 814. The first sub-metal gate cut line 540 is formed by etching through the metal gate 530, the STI region 504, and in the NMOS region of the substrate 502. In addition, the photoresist 814 is stripped to expose a surface of the hardmask 812.

Figure 8H:
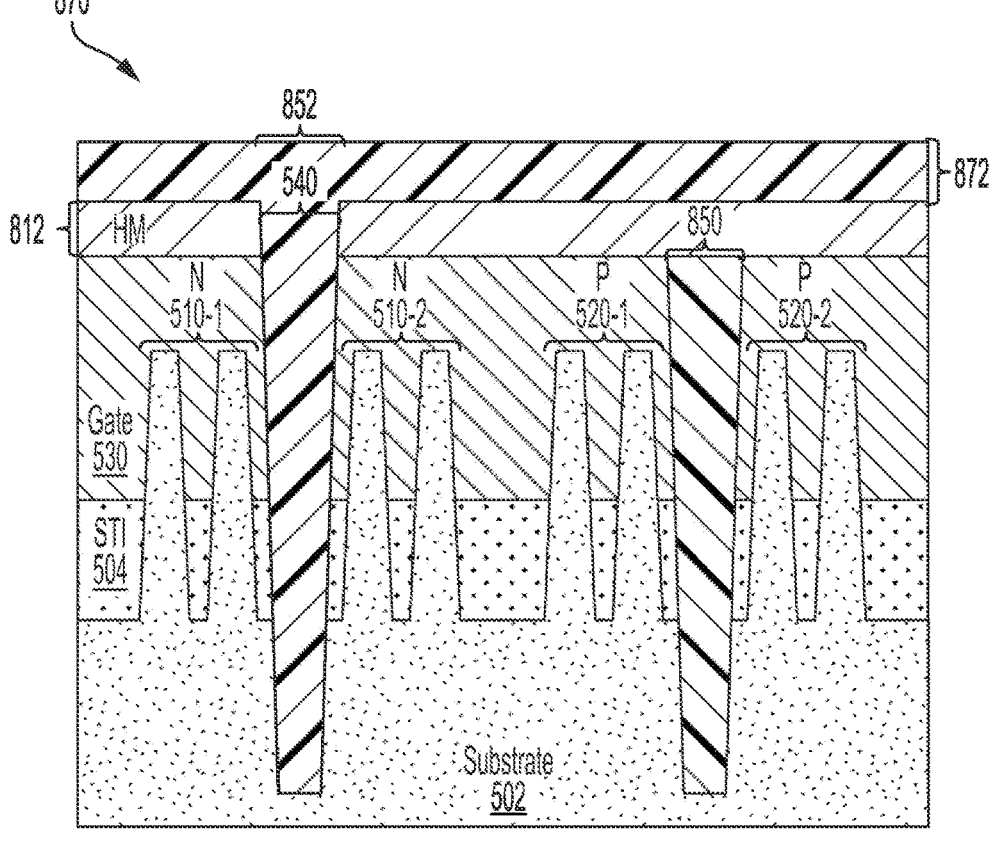

FIG. 8H illustrates a next step 870 in the process of forming the FinFET having independently strained N-type and P-type regions, according to some aspects of the present disclosure. At step 870, the first sub-metal gate cut line 540 is filled with a first stressor material 872, which is also deposited on the exposed surface of the hardmask 812. For example, as shown in FIGS. 5A and 8H, the first sub-metal gate cut line 540 is filled with a first stressor material 872 (shown in FIG. 8H), such as a post-RMG GC-filling N-type dielectric material. In this example, the first stressor material 872 is deposited in the first sub-metal gate cut line 540, through the metal gate 530, the STI region 504, in the PMOS region of the substrate 502, and on the surface of the hardmask 812.

FIG. 8I illustrates a next step 880 in the process of forming the FinFET having independently strained N-type and P-type regions, according to some aspects of the present disclosure. At step 880, the first stressor material 872 and the hardmask 812 are stripped from the metal gate 530 using, for example, a second chemical-mechanical-polishing (CMP) process. The second CMP process of step 840 to strip the first stressor material 872 and the hardmask 812 from the metal gate 530 completes formation of the first sub-metal gate cut line 540 filled with the first stressor material 872. In this example, the first stressor material 872 exhibits a compressive strain direction, and the second stressor material 832 exhibits a tensile strain direction.

In the examples provided in FIGS. 8A-8I, the first sub-metal gate cut line 540 is filled with the first stressor material 872, and the second sub-metal gate cut line 550 is filled with the second stressor material 832. In some aspects of the present disclosure, the second stressor material 832 is composed of a post-RMG GC-filling P-type dielectric material having compressive stress to provide tensile strain in the PMOS region of the FinFET 500 of FIG. 5. In these aspects of the present disclosure, the first stressor material 872 is composed of a post-RMG GC-filling N-type dielectric material having tensile stress to provide compressive strain in the NMOS region of the FinFET 500. The process shown in FIGS. 8A-8I involves two CMP processes to complete formation of the first sub-metal gate cut line 540 and the second sub-metal gate cut line 550. Unfortunately, the application of two CMP processes leads to potential concerns about a topography of the metal gate 530 due to the different post-RMG GC-filling dielectric materials used for the first stressor material 872 and the second stressor material 832.

FIGS. 9A-9G are schematic diagrams illustrating a process for forming a fin field effect transistor (FinFET) having independently strained N-type and P-type regions using ion implantation, according to some aspects of the present disclosure. The process of FIGS. 9A-9G is similar to the process shown in FIGS. 8A-8I and is described using similar reference numbers.

Figure 9A:
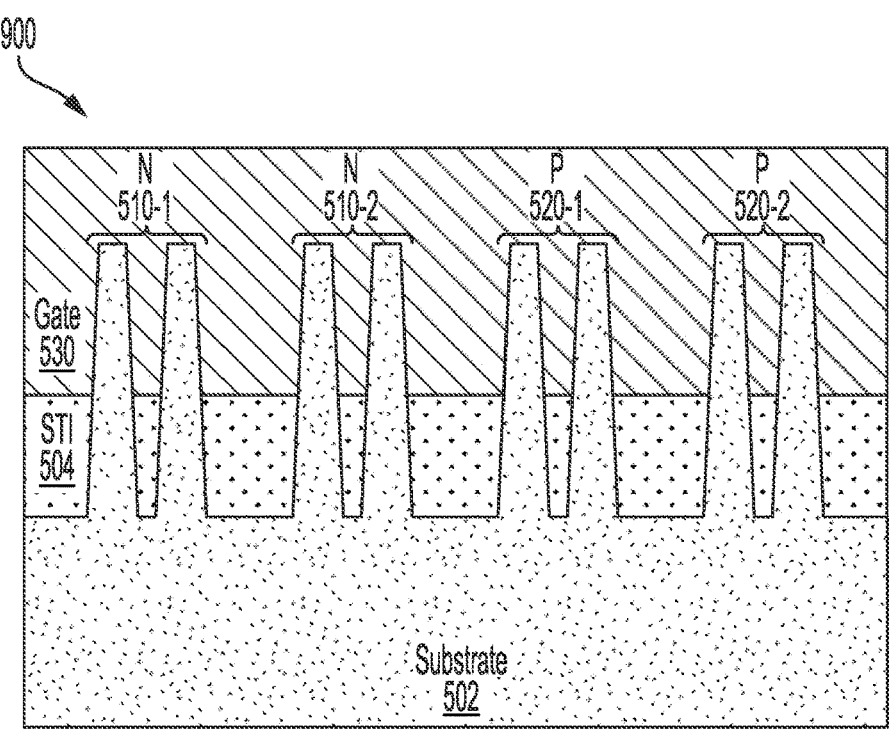

FIG. 9A illustrates a first step 900 in the process of forming the FinFET having independently strained N-type and P-type regions using ion implantation, according to some aspects of the present disclosure. In this process, the initial stage of the FinFET 500 of FIG. 5A is illustrated after a replacement metal gate (RMG) process to form the metal gate 530 on the first fin structure 510 (510-1, 510-2) and the second fin structure 520 (520-1, 520-2).

Figure 9B:
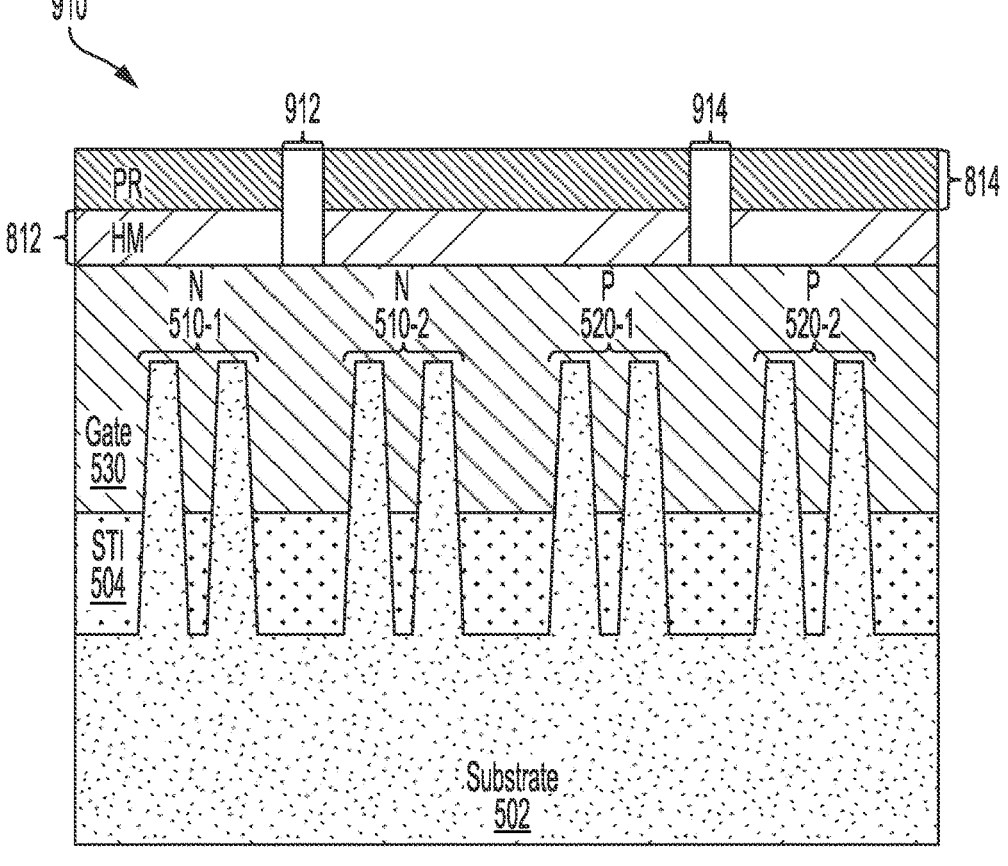

FIG. 9B illustrates a next step 910 in the process of forming the FinFET having independently strained N-type and P-type regions using ion implantation, according to some aspects of the present disclosure. At step 910, a hardmask (HM) 812 is deposited on a surface of the metal gate 530. Once the hardmask 812 is formed, a photoresist (PR) 814 is deposited on the hardmask 812. Following formation of the photoresist 814, the photoresist 814 and the hardmask 812 are patterned to form a first opening 912 and a second opening 914. The first opening 912 and the second opening 914 are provided in preparation for etching of the first sub-metal gate cut line 540 in the NMOS region and the second sub-metal gate cut line 550 in the PMOS region of the substrate 502, as shown in FIG. 9C.

Figure 9C:
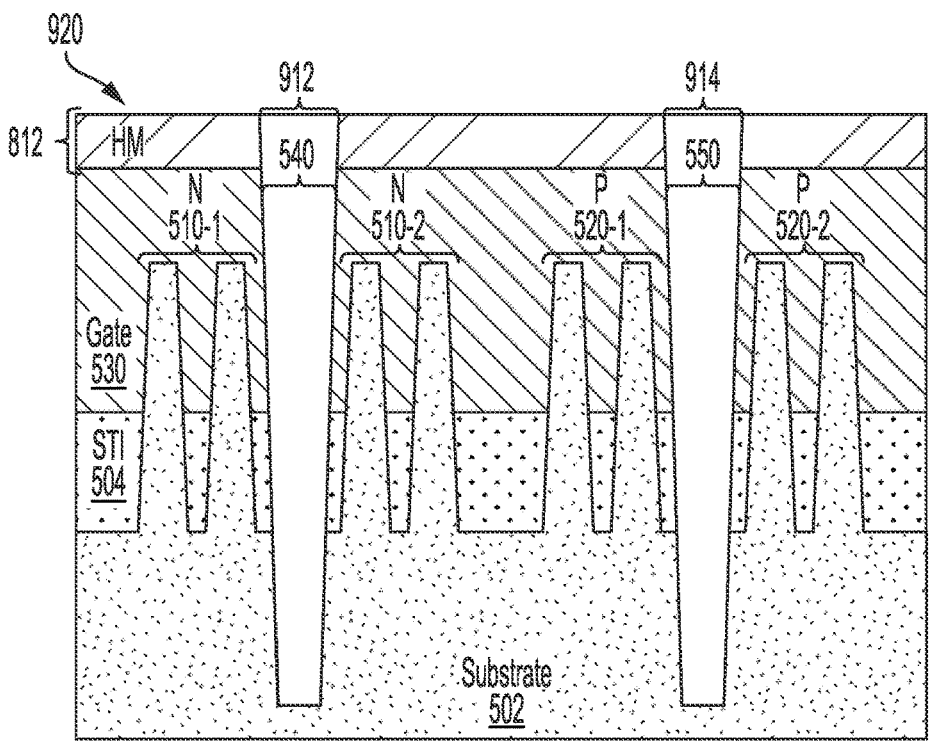

FIG. 9C illustrates a next step 920 in the process of forming the FinFET having independently strained N-type and P-type regions, according to some aspects of the present disclosure. At step 920, a gate-cut trench etch is performed following the first opening 912 and the second opening 914 in the hardmask 812 and the photoresist 814. The first sub-metal gate cut line 540 is formed by etching through the metal gate 530, the STI region 504, and in the NMOS region of the substrate 502 through the first opening 912. The second sub-metal gate cut line 550 is formed by etching through the metal gate 530, the STI region 504, and in the PMOS region of the substrate 502. In addition, the photoresist 814 is stripped to expose a surface of the hardmask 812.

Figure 9D:
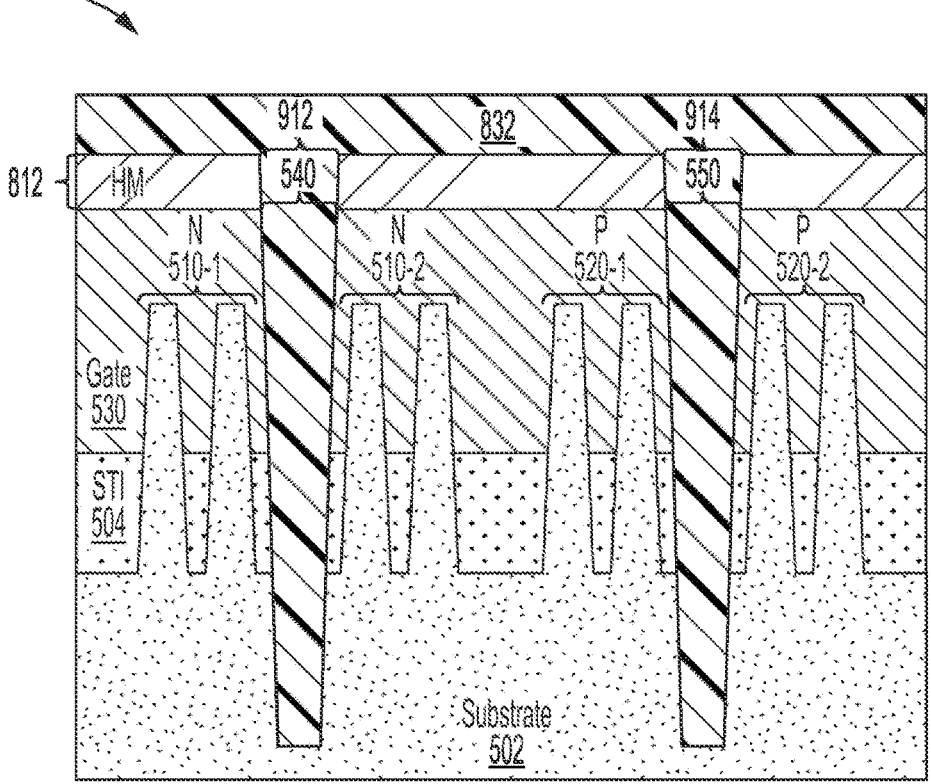

FIG. 9D illustrates a next step 930 in the process of forming the FinFET having independently strained N-type and P-type regions through ion implantation, according to some aspects of the present disclosure. At step 930, the first sub-metal gate cut line 540 and the second sub-metal gate cut line 550 are filled with the second stressor material 832 through the first opening 912 and the second opening 914. The second stressor material 832 is also deposited on the exposed surface of the hardmask 812. For example, as shown in FIGS. 5A and 9D, the first sub-metal gate cut line 540 and the second sub-metal gate cut line 550 are filled with the second stressor material 832 (shown in FIG. 9D) (e.g., the post-RMG GC-filling P-type dielectric material), which is also deposited on the surface of the hardmask 812.

Figure 9E:
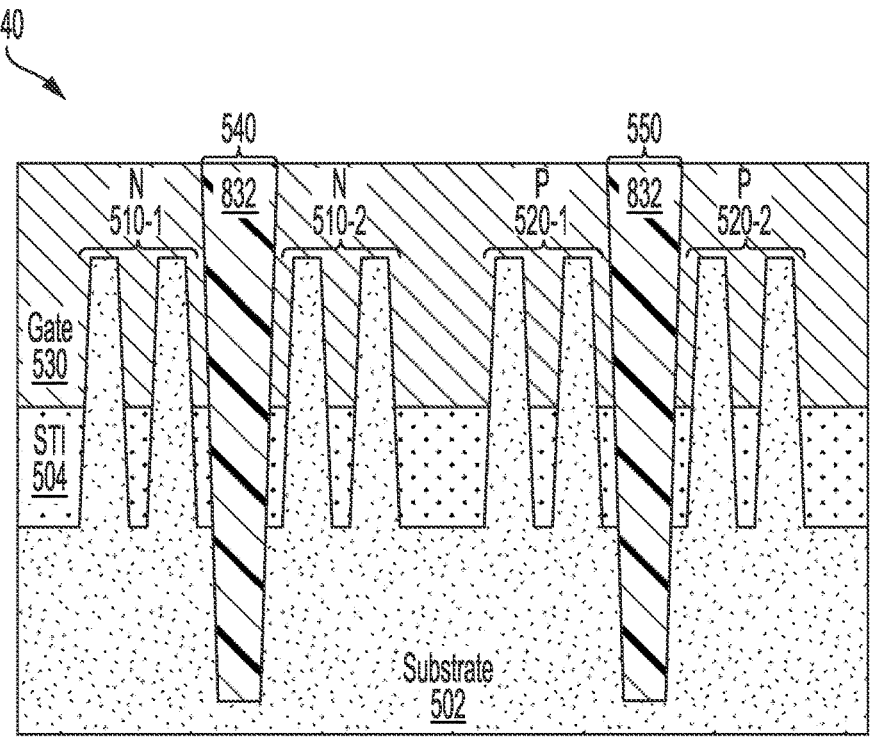

FIG. 9E illustrates a next step 940 in the process of forming the FinFET having independently strained N-type and P-type regions through ion implantation, according to some aspects of the present disclosure. At step 940, the second stressor material 832 and the hardmask 812 are stripped from the metal gate 530 using, for example, a chemical-mechanical-polishing (CMP) process. The CMP process of step 940 to strip the second stressor material 832 and the hardmask 812 from the metal gate 530 completes formation of the second sub-metal gate cut line 550 filled with the second stressor material 832; however, formation of the first sub-metal gate cut line 540 is incomplete due to the presence of the second stressor material 832.

Figure 9F:
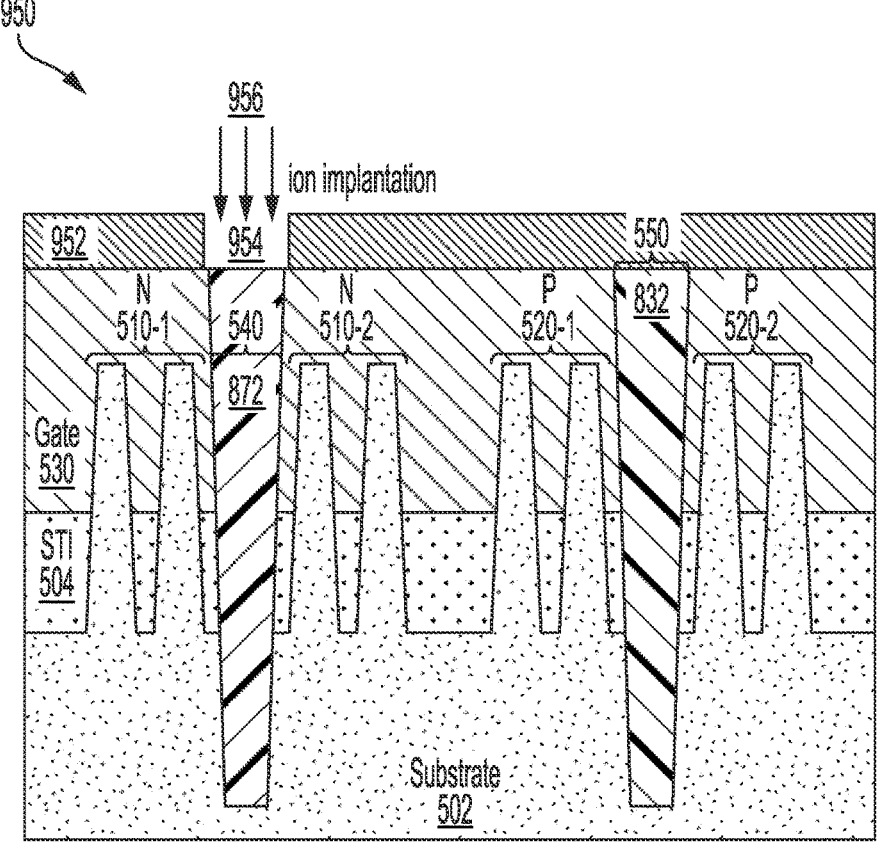

FIG. 9F illustrates a next step 950 in the process of forming the FinFET having independently strained N-type and P-type regions through ion implantation, according to some aspects of the present disclosure. At step 950, a photoresist 952 is deposited on the surface of the metal gate 530. Following formation of the photoresist 952, the photoresist 952 is patterned to form an opening 954. Once the opening 954 is formed, a first stressor material 872 in the first sub-metal gate cut line 540 is implanted with a species having a larger lattice constant (e.g., germanium (Ge), argon (Ar)). An ion implantation 956 is performed to convert the second stressor material 832 into the first stressor material 872 in the NMOS region of the substrate 502. In some aspects of the present disclosure, the ion implantation species include, but are not limited to fluorine (F), nitrogen (N), silicon (Si), germanium (Ge), and argon (Ar).

FIG. 9G illustrates a next step 960 in the process of forming the FinFET having independently strained N-type and P-type regions through ion implantation, according to some aspects of the present disclosure. At step 960, the photoresist 952 is stripped from the metal gate 530 and low temperature annealing is performed. The low temperature annealing following stripping of the photoresist 952 from the metal gate 530 completes formation of the first sub-metal gate cut line 540 filled with the first stressor material 872. The process shown in FIGS. 9A-9G utilizes a single chemical-mechanical-polishing (CMP) process to avoid potential concerns about a topography of the metal gate 530 by using the same, second stressor material 832 during the CMP process shown in step 940 of FIG. 9E.

the examples provided in FIGS. 9A-9G, the first sub-metal gate cut line 540 and the second sub-metal gate cut line 550 are both filled with the second stressor material 832. The process shown in FIGS. 9A-9G involves one CMP process to complete planarization of the metal gate 530. Fortunately, the application of a single CMP processes avoids potential concerns regarding a topography of the metal gate 530 by using the same post-RMG GC-filling dielectric material (e.g., the second stressor material 832).

FIG. 10 is a process flow diagram illustrating a method 1000 of fabricating a field effect transistor (FET) having independently strained N-type and P-type regions, according to aspects of the present disclosure. The method 1000 may begin at block 1002, in which a dummy gate is replaced to form a metal gate on a shallow trench isolation (STI) region on a substrate and on a first fin structure and a second fin structure on the substrate. For example, as shown in FIG. 7, at block 708, a replacement metal gate (RMG) process is performed to replace a dummy poly gate with a metal gate. Additionally, as shown in FIG. 5A, the FinFET 500 includes the metal gate 530 on the STI region 504, on the first fin structure 510 (510-1, 510-2), and on the second fin structure 520 (520-1, 520-2).

At block 1004, a line-cut is applied to separate the metal gate to form a first sub-metal gate cut line and a second sub-metal gate cut line. For example, as shown in FIG. 7, at block 710, a gate cut process is performed following the RMG process of block 708. Additionally, as shown in FIG. 5A, the metal gate 530 is composed of a first sub-metal gate cut line 540 and a second sub-metal gate cut line 550. In this example, the first sub-metal gate cut line 540 and the second sub-metal gate cut line 550 extend through the metal gate 530, through the STI region 504, and into the substrate 502. The metal gate 530 may be a high-K metal gate (HKMG).

At block 1006, the second sub-metal gate cut line is filled with a second stressor material. For example, at step 830 of FIG. 8D, the second sub-metal gate cut line 550 is filled with a second stressor material 832, which is also deposited on the exposed surface of the hardmask 812. Additionally, as shown in FIGS. 5A and 8D, the second sub-metal gate cut line 550 is filled with the second stressor material 832 (shown in FIG. 8D), such as a post-RMG GC-filling P-type dielectric material through the metal gate 530, the STI region 504, in the PMOS region of the substrate 502, and on the surface of the hardmask 812.

At block 1008, the first sub-metal gate cut line is filled with a first stressor material. For example, as shown in FIG. 8H, the first sub-metal gate cut line 540 is filled with a first stressor material 872, which is also deposited on the exposed surface of the hardmask 812. Additionally, as shown in FIGS. 5A and 8D, the first sub-metal gate cut line 540 is filled with a first stressor material 872, such as a post-RMG GC-filling N-type dielectric material. In this example, the first stressor material 872 is deposited in the first sub-metal gate cut line 540, through the metal gate 530, the STI region 504, in the PMOS region of the substrate 502, and on the surface of the hardmask 812.

FIG. 11 is a process flow diagram illustrating a method 1100 of fabricating a field effect transistor (FET) having independently strained N-type and P-type regions, according to aspects of the present disclosure. Blocks 1102-1106 of the method 1100 correspond to blocks 1002-1006 of the method 1000 of FIG. 10 and are not further described here. At block 1108, the first sub-metal gate cut line is filled with the second stressor material. For example, as shown in FIG. 9D, the first sub-metal gate cut line 540 and the second sub-metal gate cut line 550 are filled with the second stressor material 832 through the first opening 912 and the second opening 914. Additionally, as shown in FIGS. 5A and 9D, the first sub-metal gate cut line 540 and the second sub-metal gate cut line 550 are filled with the second stressor material 832 (shown in FIG. 9D) (e.g., the post-RMG GC-filling P-type dielectric material), which is also deposited on the surface of the hardmask 812.

At block 1110, ions are implanted in the second stressor material in the first sub-metal gate cut line to convert the second stressor material to a first stressor material. For example, as shown in FIG. 9F, the second stressor material 832 in the first sub-metal gate cut line 540 is implanted with a species have a larger lattice constant (e.g., germanium (Ge), argon (Ar)). In this example, the ion implantation 956 is performed to convert the second stressor material 832 into the first stressor material 872 in the NMOS region of the substrate 502. As shown in FIG. 9G, low temperature annealing performed. The low temperature annealing following stripping of the photoresist 952 from the metal gate 530 completes formation of the first sub-metal gate cut line 540 filled with the first stressor material 872.

Figure 12:
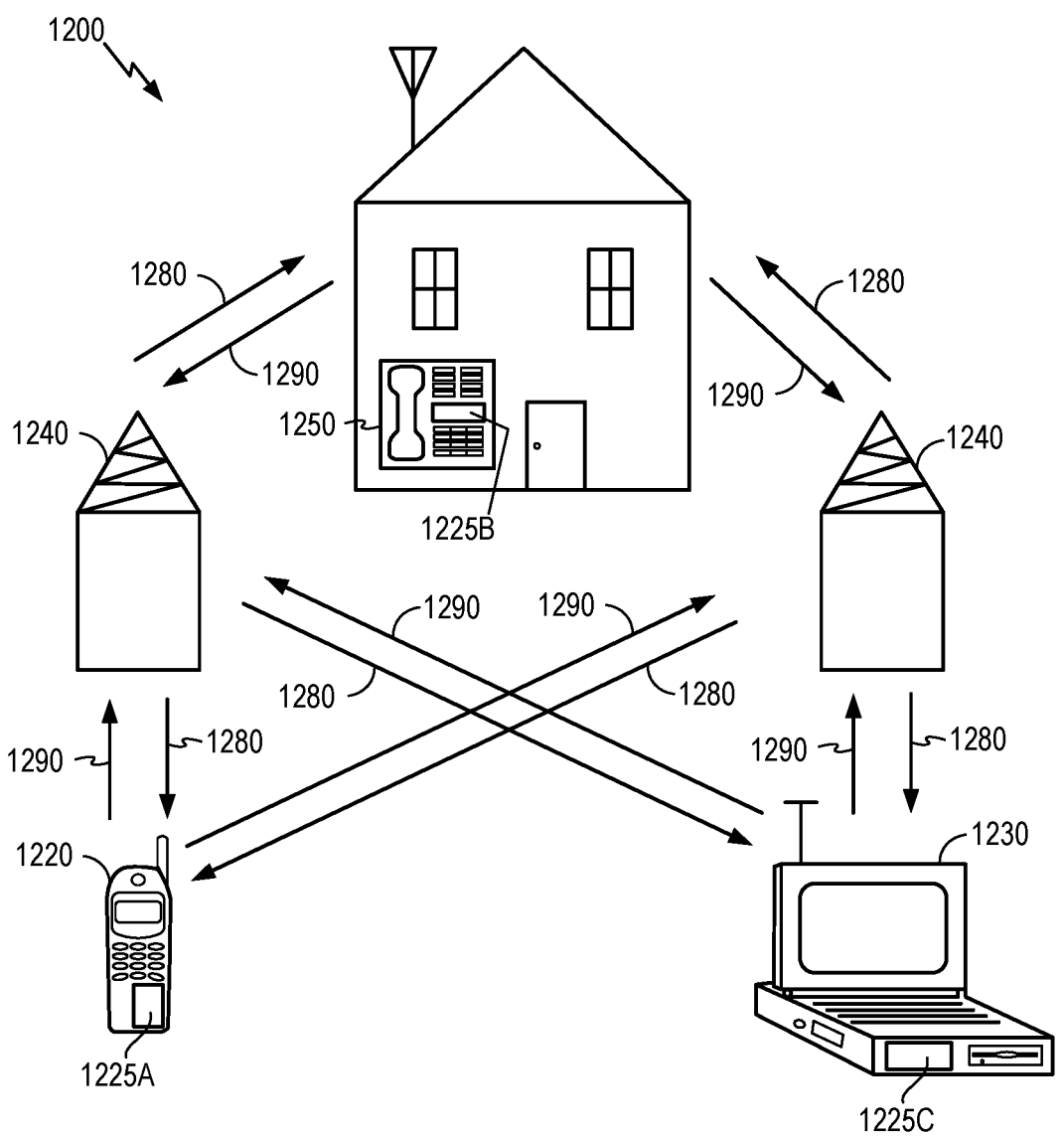
FIG. 12 is a block diagram showing an exemplary wireless communications system in which an aspect of the disclosure may be advantageously employed.

FIG. 12 is a block diagram showing an exemplary wireless communications system 1200 in which an aspect of the disclosure may be advantageously employed. For purposes of illustration, FIG. 12 shows three remote units 1220, 1230, and 1250, and two base stations 1240. It will be recognized that wireless communications systems may have many more remote units and base stations. Remote units 1220, 1230, and 1250 include IC devices 1225A, 1225C, and 1225B that include the disclosed FinFETs. It will be recognized that other devices may also include the disclosed FinFETs, such as the base stations, switching devices, and network equipment. FIG. 12 shows forward link signals 1280 from the base station 1240 to the remote units 1220, 1230, and 1250, and reverse link signals 1290 from the remote units 1220, 1230, and 1250 to base station 1240.

In FIG. 12, remote unit 1220 is shown as a mobile telephone, remote unit 1230 is shown as a portable computer, and remote unit 1250 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit such as meter reading equipment, or other devices that store or retrieve data or computer instructions, or combinations thereof. Although FIG. 12 illustrates remote units according to the aspects of the disclosure, the disclosure is not limited to these exemplary illustrated units. Aspects of the disclosure may be suitably employed in many devices, which include the disclosed FinFETs.

Figure 13:
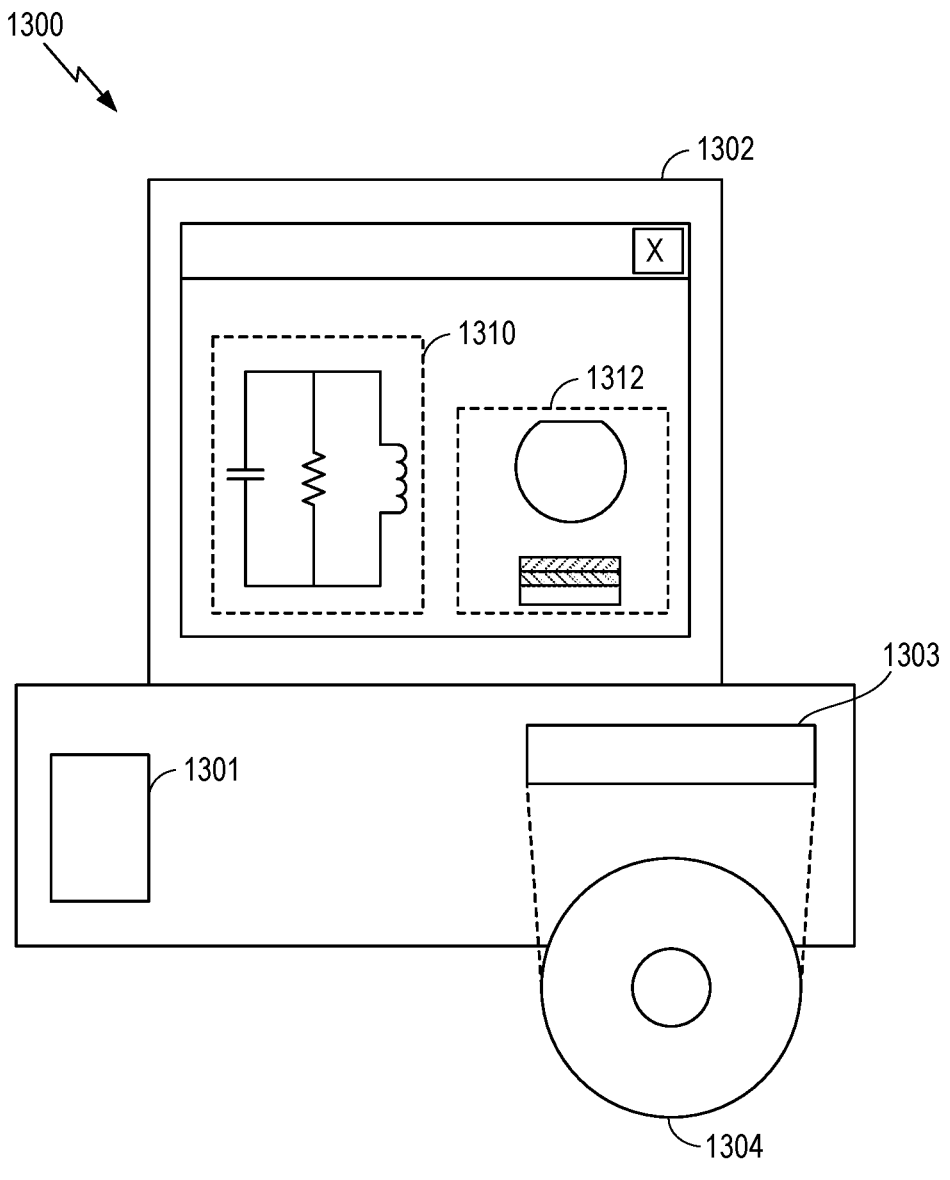
FIG. 13 is a block diagram illustrating a design workstation used for circuit, layout, and logic design of a transistor structure according to one configuration.

FIG. 13 is a block diagram illustrating a design workstation used for circuit, layout, and logic design of an IC structure, such as the FinFET disclosed above. A design workstation 1300 includes a hard disk 1301 containing operating system software, support files, and design software such as Cadence or OrCAD. The design workstation 1300 also includes a display 1302 to facilitate design of a circuit 1310 or a fin structure 1312 including a FinFET. A storage medium 1304 is provided for tangibly storing the design of the circuit 1310 or the fin structure 1312. The design of the circuit 1310 or the fin structure 1312 may be stored on the storage medium 1304 in a file format such as GDSII or GERBER. The storage medium 1304 may be a CD-ROM, DVD, hard disk, flash memory, or other appropriate device. Furthermore, the design workstation 1300 includes a drive apparatus 1303 for accepting input from or writing output to the storage medium 1304.

Data recorded on the storage medium 1304 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1304 facilitates the design of the circuit 1310 or the fin structure 1312 by decreasing the number of processes for designing semiconductor wafers.

For a firmware and/or software implementation, the methodologies may be implemented with modules (e.g., procedures, functions, and so on) that perform the functions described herein. Machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer. Disk and disc, as used herein, include compact disc (CD), laser disc, optical disc, digital versatile disc (DVD), floppy disk and Blu-ray® disc where disks usually reproduce data magnetically, while discs reproduce data optically with lasers. Combinations of the above should also be included within the scope of computer-readable media.

In addition to storage on computer readable medium, instructions and/or data may be provided as signals on transmission media included in a communication apparatus. For example, a communication apparatus may include a transceiver having signals indicative of instructions and data. The instructions and data are configured to cause one or more processors to implement the functions outlined in the claims.

Implementation examples are described in the following numbered clauses:

1. A fin field effect transistor (FinFET), comprising:

a substrate;

a shallow trench isolation (STI) region on the substrate;

a first fin structure on the substrate and extending through the STI region;

a second fin structure on the substrate and extending through the STI region; and a metal gate on the STI region, on the first fin structure, and on the second fin structure, the metal gate comprising a first sub-metal gate cut line filled with a first stressor material, and a second sub-metal gate cut line filled with a second stressor material different from the first stressor material.

2. The FinFET of clause 1, in which the first stressor material comprises a compressive strain and the second stressor material comprises a tensile strain.

3. The FinFET of clause 2, in which the first fin structure comprises a P-type metal oxide semiconductor (PMOS) region, and the second fin structure comprises an N-type metal oxide semiconductor (NMOS) region.

4. The FinFET of any of clauses 1-3, in which the first sub-metal gate cut line and the second sub-metal gate cut line extend through the metal gate to the STI region.

5. The FinFET of any of clauses 1-3, in which the first sub-metal gate cut line and the second sub-metal gate cut line extend through the metal gate, through the STI region, and into the substrate.

6. The FinFET of any of clauses 1-5, in which the metal gate comprises a high-K metal gate.

7. The FinFET of any of clauses 1-6, in which the first fin structure comprises:

a first P-type metal oxide semiconductor (PMOS) region; and a second PMOS region, in which the first sub-metal gate cut line is coupled between the first PMOS region and the second PMOS region.

8. The FinFET of any of clauses 1-7, in which the second fin structure comprises:

a first N-type metal oxide semiconductor (NMOS) region; and a second NMOS region, in which the second sub-metal gate cut line is coupled between the first NMOS region and the second NMOS region.

9. The FinFET of any of clauses 1-8, in which the first and second stressor materials comprise silicon dioxide ($SiO_2$) silicon dioxide fluorine ($SiO_2$:F), silicon dioxide nitrogen ($SiO_2$:N), silicon dioxide germanium ($SiO_2$:Ge), silicon oxynitride (SiON), silicon oxynitride fluorine (SiON:F), silicon oxynitride germanium (SiON:Ge), silicon nitride (SiN), silicon nitride germanium (SiN:Ge), hafnium oxide ($HfO_2$), hafnium zirconium oxide ($HfZrO_2$), zirconium oxide ($ZrO_2$), hafnium lanthanum oxide (HfLaO), lanthanum oxide ($LaO_2$), germanium oxide (GeOx), and/or silicon germanium oxide (SiGeOx).

10. The FinFET of any of clauses 1-8, in which the second stressor material comprises an ion implantation species, comprising fluorine (F), nitrogen (N), silicon (Si), germanium (Ge), and argon (Ar).

11. A method comprising:

replacing a dummy gate to form a metal gate on a shallow trench isolation (STI) region on a substrate, and on a first fin structure and a second fin structure on the substrate;

applying a line-cut to separate the metal gate to form a first sub-metal gate cut line and a second sub-metal gate cut line;

filling the first sub-metal gate cut line with a first stressor material; and filling the second sub-metal gate cut line with a second stressor material different from the first stressor material.

12. The method of clause 11, in which applying the line-cut, comprises:

depositing a hardmask on a surface of the metal gate;

depositing a photoresist (PR) on the hardmask;

patterning the photoresist and the hardmask to form an opening;

etching through the opening in the photoresist and the hardmask to form the first sub-metal gate cut line through the metal gate and the STI region in a P-type metal oxide semiconductor (PMOS) region of the substrate; and stripping the photoresist to expose a surface of the hardmask.

13. The method of clause 12, in which filling the first sub-metal gate cut line with the first stressor material, comprises:

depositing the first stressor material in the first sub-metal gate cut line;

depositing the first stressor material on the exposed surface of the hardmask; and polishing the first stressor material and the hardmask on the surface of the metal gate.

14. The method of any of clauses 11-13, in which applying the line-cut, comprises:

depositing a hardmask on a surface of the metal gate and on a portion of the first stressor material;

depositing a photoresist (PR) on the hardmask;

patterning the photoresist and the hardmask to form an opening;

etching through the opening in the photoresist and the hardmask to form the second sub-metal gate cut line through the metal gate and the STI region in an N-type metal oxide semiconductor (NMOS) region of the substrate; and stripping the photoresist to expose a surface of the hardmask.

15. The method of clause 14, in which filling the second sub-metal gate cut line with the second stressor material, comprises:

depositing the second stressor material in the second sub-metal gate cut line;

depositing the second stressor material on the exposed surface of the hardmask; and polishing the second stressor material and the hardmask on the surface of the metal gate.

16. A method comprising:

replacing a dummy gate to form a metal gate on a shallow trench isolation (STI) region on a substrate and on a first fin structure and a second fin structure on the substrate;

applying a line-cut to separate the metal gate to form a first sub-metal gate cut line and a second sub-metal gate cut line;

filling the first sub-metal gate cut line and the second sub-metal gate cut line with a first stressor material; and implanting ions in the first stressor material in the second sub-metal gate cut line to convert the first stressor material to a second stressor material that is different from the first stressor material.

17. The method of clause 16, in which applying the line-cut, comprises:

depositing a hardmask on a surface of the metal gate;

depositing a photoresist (PR) on the hardmask;

patterning the photoresist and the hardmask to form a first opening and a second opening;

etching through the first opening in the photoresist and the hardmask to form the first sub-metal gate cut line through the metal gate and the STI region in a P-type metal oxide semiconductor (PMOS) region of the substrate;

etching through the second opening in the photoresist and the hardmask to form the second sub-metal gate cut line through the metal gate and the STI region in an N-type metal oxide semiconductor (NMOS) region of the substrate; and stripping the photoresist to expose a surface of the hardmask.

18. The method of clause 17, in which filling the first sub-metal gate cut line and the second sub-metal gate cut line with the first stressor material, comprises:

depositing the first stressor material in the first sub-metal gate cut line and the second sub-metal gate cut line;

depositing the first stressor material on the exposed surface of the hardmask; and polishing the first stressor material and the hardmask on the surface of the metal gate.

19. The method of any of clauses 16-18, in which implanting ions, comprises:

depositing a photoresist (PR) on a surface of the metal gate and on portions of the first stressor material;

patterning the photoresist to form an opening; and implanting an ion implantation species through the opening in the photoresist to convert the first stressor material in the second sub-metal gate cut line to the second stressor material.

20. The method of clause 19, in which the ion implantation species comprises fluorine (F), nitrogen (N), silicon (Si), germanium (Ge), and argon (Ar).

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general-purpose or special-purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. A fin field effect transistor (FinFET), comprising:
   a substrate;
   a shallow trench isolation (STI) region on the substrate;
   a first fin structure on the substrate and extending through the STI region;
   a second fin structure on the substrate and extending through the STI region; and
   a metal gate on the STI region, on the first fin structure, and on the second fin structure;
   a first sub-metal gate cut line filled with a first stressor material; and
   a second sub-metal gate cut line filled with a second stressor material different from the first stressor material, in which the first sub-metal gate cut line and the second sub-metal gate cut line extend through the metal gate, through the STI region, and into the substrate beyond a base of the first fin structure and the second fin structure on the substrate.

2. The FinFET of claim 1, in which the first stressor material comprises a compressive strain and the second stressor material comprises a tensile strain.

3. The FinFET of claim 2, in which the first fin structure comprises a P-type metal oxide semiconductor (PMOS) region, and the second fin structure comprises an N-type metal oxide semiconductor (NMOS) region.

4. The FinFET of claim 1, in which the metal gate comprises a high-K metal gate.

5. The FinFET of claim 1, in which the first fin structure comprises:
   a first P-type metal oxide semiconductor (PMOS) region; and
   a second PMOS region, in which the first sub-metal gate cut line is coupled between the first PMOS region and the second PMOS region.

6. The FinFET of claim 1, in which the second fin structure comprises:
   a first N-type metal oxide semiconductor (NMOS) region; and
   a second NMOS region, in which the second sub-metal gate cut line is coupled between the first NMOS region and the second NMOS region.

7. The FinFET of claim 1, in which the first and second stressor materials comprise silicon dioxide (SiO$_2$,) silicon dioxide fluorine ($SiO_2$:F), silicon dioxide nitrogen ($SiO_2$:N), silicon dioxide germanium ($SiO_2$:Ge), silicon oxynitride (SiON), silicon oxynitride fluorine (SiON:F), silicon oxynitride germanium (SiON:Ge), silicon nitride (SiN), silicon nitride germanium (SiN:Ge), hafnium oxide ($HfO_2$), hafnium zirconium oxide ($HfZrO_2$), zirconium oxide ($ZrO_2$), hafnium lanthanum oxide (HfLaO), lanthanum oxide ($LaO_2$), germanium oxide (GeOx), and/or silicon germanium oxide (SiGeOx).

8. The FinFET of claim 1, in which the second stressor material comprises ion implantation species, comprising fluorine (F), nitrogen (N), silicon (Si), germanium (Ge), and argon (Ar).

* * * * *